United States Patent
Akiyama

(10) Patent No.: US 9,738,807 B2
(45) Date of Patent: Aug. 22, 2017

(54) METHOD OF FORMING PATTERN AND PATTERN

(71) Applicant: KABUSHIKI KAISHA TOSHIBA, Tokyo (JP)

(72) Inventor: Masahiko Akiyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/848,114

(22) Filed: Sep. 8, 2015

(65) Prior Publication Data

US 2016/0102221 A1 Apr. 14, 2016

(30) Foreign Application Priority Data

Oct. 8, 2014 (JP) .................... 2014-207483
Aug. 25, 2015 (JP) .................... 2015-166082

(51) Int. Cl.

| H05K 1/03 | (2006.01) |
|---|---|
| C09D 11/52 | (2014.01) |
| H05K 1/02 | (2006.01) |
| H05K 3/12 | (2006.01) |
| H01L 51/00 | (2006.01) |

(52) U.S. Cl.
CPC .......... *C09D 11/52* (2013.01); *H01L 51/0004* (2013.01); *H05K 1/0296* (2013.01); *H05K 3/1208* (2013.01); *H05K 2203/1173* (2013.01)

(58) Field of Classification Search
CPC .. C09D 11/52; H01L 51/0004; H05K 1/0296; H05K 3/1208; H05K 2203/1173
USPC .................. 174/255, 250, 256–258
See application file for complete search history.

(56) References Cited

U.S. PATENT DOCUMENTS

| 2005/0202348 A1 | 9/2005 | Nakayama et al. |
| 2015/0270488 A1 | 9/2015 | Akiyama |

FOREIGN PATENT DOCUMENTS

| JP | 08-307022 A | 11/1996 |
| JP | 2004-351305 | 12/2004 |
| JP | 2005-289054 | 10/2005 |
| JP | 2006-208750 | 8/2006 |
| JP | 2007-335460 A | 12/2007 |
| JP | 2008-159798 A | 7/2008 |

(Continued)

OTHER PUBLICATIONS

Okada (Japanese Patent Publication No. 2007-335460), Dec. 27, 2007—Machine Translation.*

(Continued)

*Primary Examiner* — Tremesha S Willis
(74) *Attorney, Agent, or Firm* — Finnegan, Henderson, Farabow, Garrett & Dunner, L.L.P.

(57) ABSTRACT

According to one embodiment, a method of forming a pattern includes preparing a substrate having a liquid-repellent face and a lyophilic pattern which are located adjacent to each other on a surface of the substrate, the lyophilic pattern having a surface energy different from the liquid-repellent face, bringing ink into contact with the substrate, and applying the ink to the lyophilic pattern by moving a contacted ink surface. The lyophilic pattern includes a linear main lyophilic pattern and an auxiliary lyophilic pattern connected to the lyophilic pattern. A liquid-repellent region is defined in the liquid-repellent face between the main lyophilic pattern and the auxiliary lyophilic pattern.

10 Claims, 21 Drawing Sheets

(56) References Cited

FOREIGN PATENT DOCUMENTS

| JP | 2009-300826 A | 12/2009 |
| JP | 2013-207071 | 10/2013 |
| JP | 2015-179765 | 10/2015 |

OTHER PUBLICATIONS

Notification of Reasons for Refusal issued by the Japanese Patent Office on Aug. 18, 2016, in counterpart Japanese Patent Application No. 2015-166082.

* cited by examiner

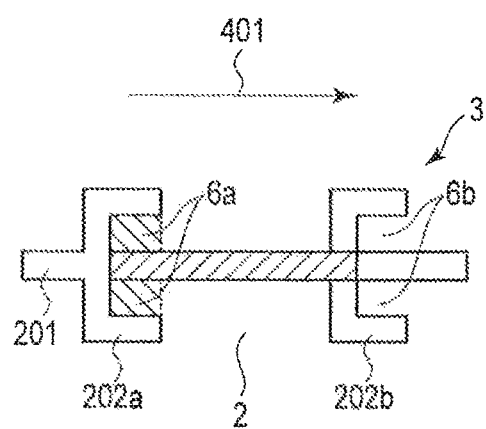
F I G. 7

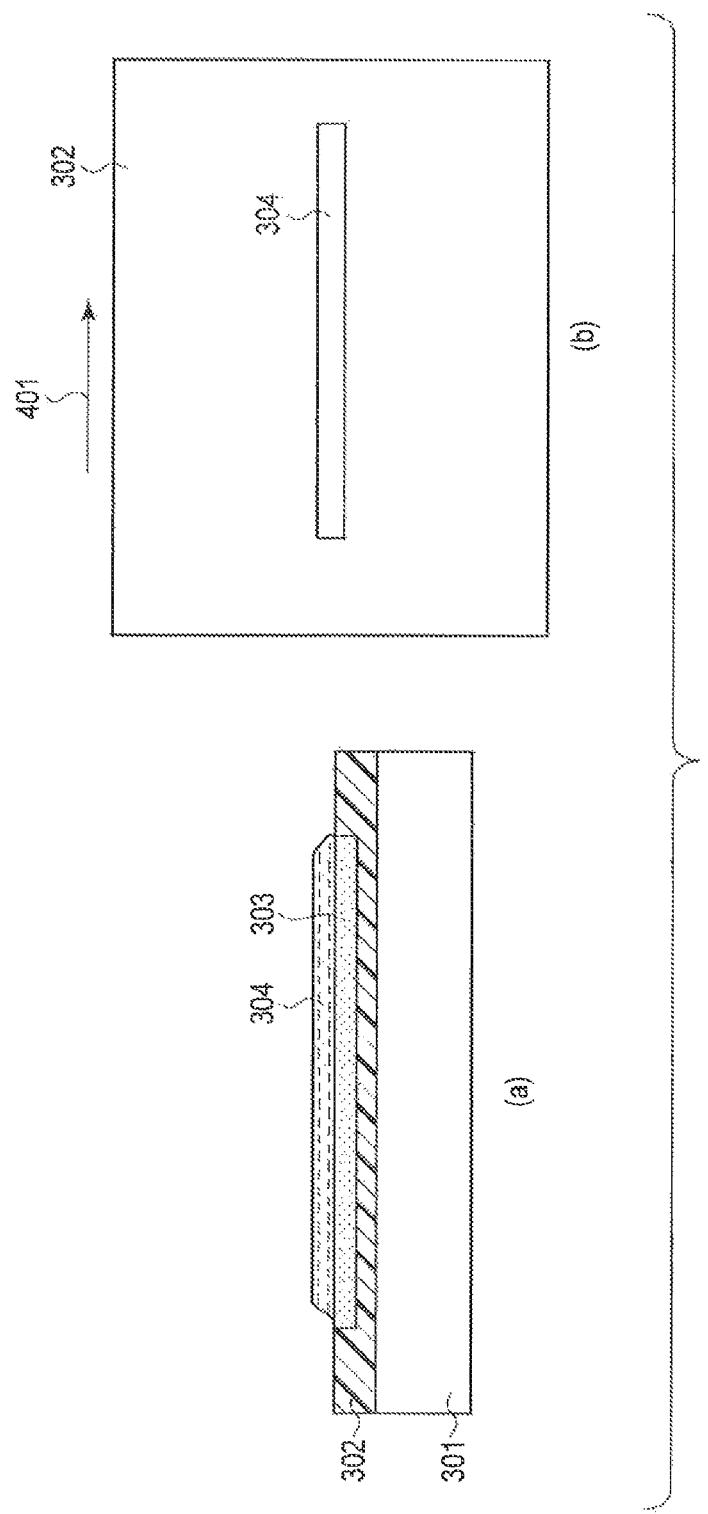

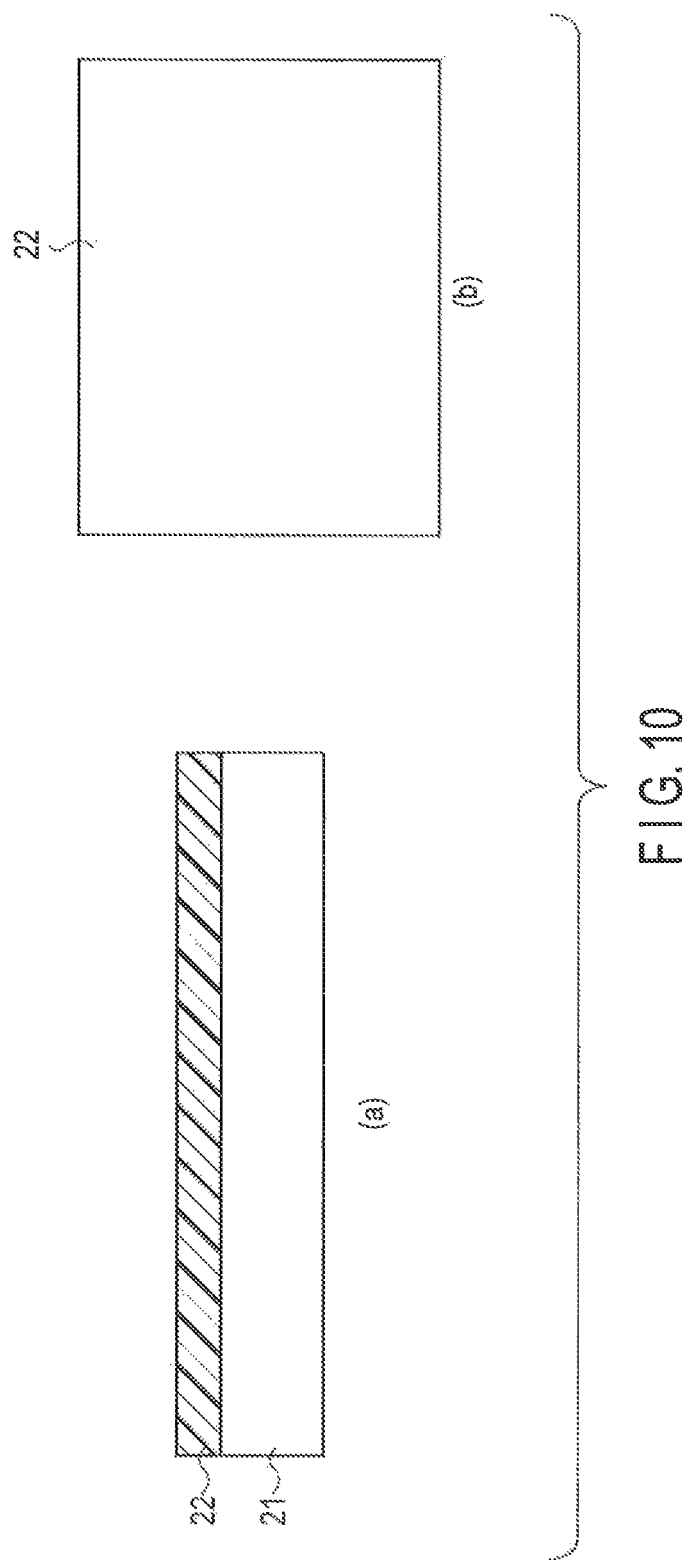

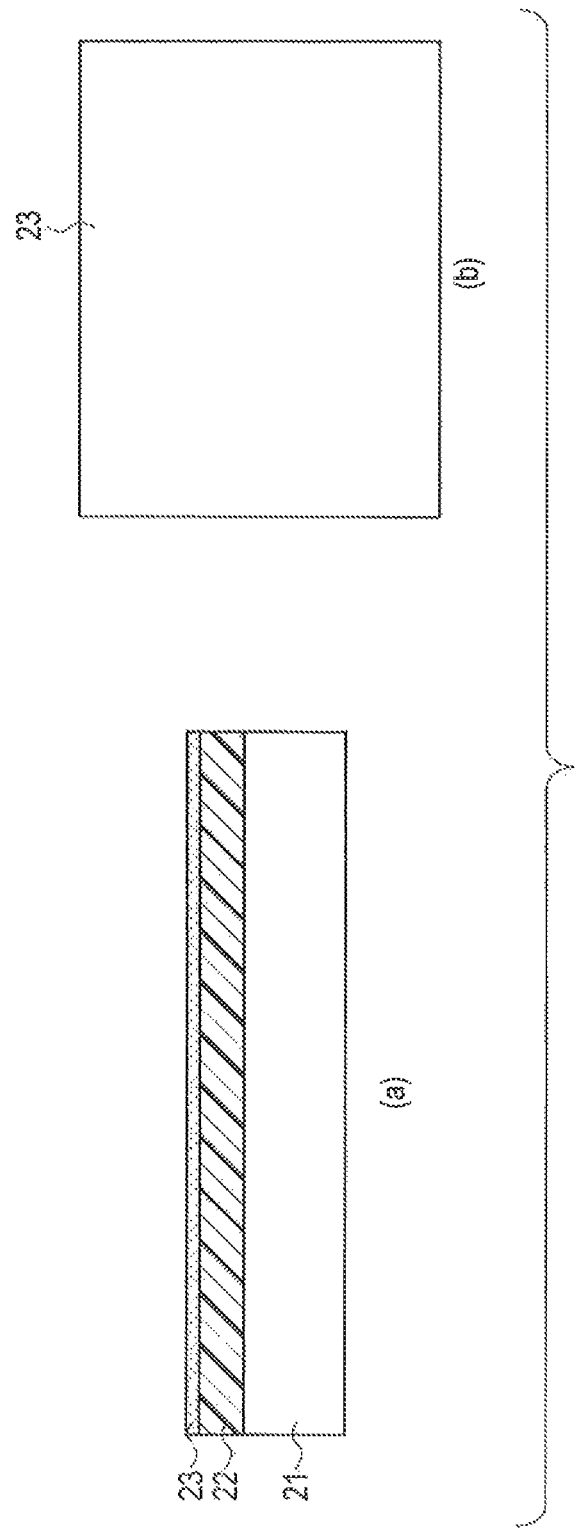

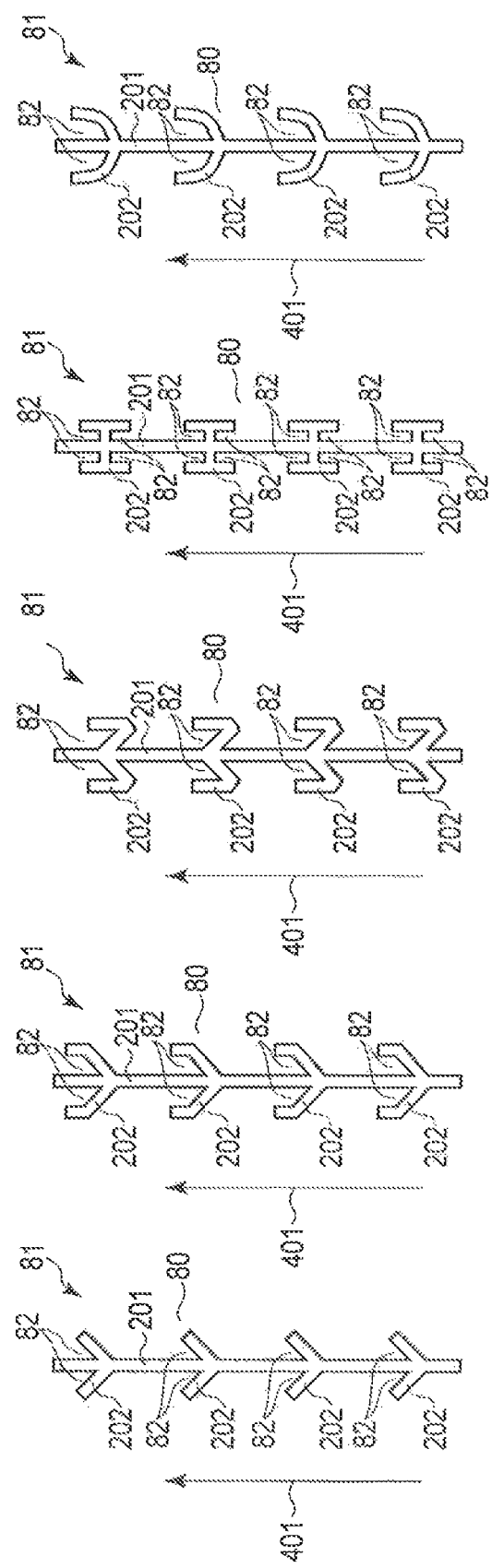

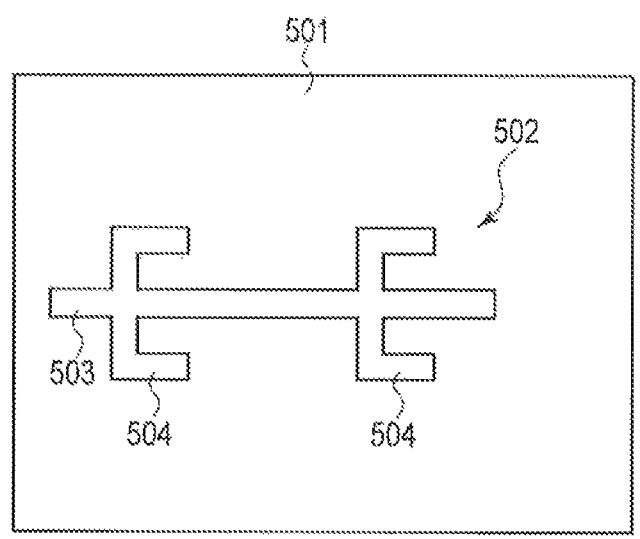
F I G. 26

METHOD OF FORMING PATTERN AND PATTERN

CROSS-REFERENCE TO RELATED APPLICATIONS

This application is based upon and claims the benefit of priority from Japanese Patent Applications No. 2014-207483, filed Oct. 8, 2014; and No. 2015-166082, filed Aug. 25, 2015, the entire contents of all of which are incorporated herein by reference.

FIELD

Embodiments described herein relate generally to a method of forming a pattern and a pattern.

BACKGROUND

Pattern formation using printing is considered as a method of forming an electronic device at low cost. For example, screen printing, gravure printing and ink-jet printing are known as printing methods. However, these printing methods make it difficult to form a fine pattern if the methods are used without modification.

In consideration of this factor, the following method of forming a fine pattern is known. For example, the surface of the substrate for printing is made liquid-repellent. On the liquid-repellent (lyophobic) surface, a lyophilic pattern is formed. In this manner, the surface wettability of the target substrate is made different depending on the region. By applying ink onto the lyophilic pattern through printing, the pattern boundary can be clear. Thus, a fine pattern can be formed.

Ink-jet printing is also known as a printing method to be applied. In ink-jet printing, ink is supplied as droplets. Thus, the ink amount on the lyophilic pattern of the substrate can be adjusted in terms of locations. The size of ink droplets is preferably large in view of productivity and accuracy of landing positions.

In a dip method or a die coating method, ink comes into contact with the surface of the substrate when applied. Thus, ink can be left along the lyophilic pattern. It is possible to realize alignment accuracy and form a fine pattern.

BRIEF DESCRIPTION OF THE DRAWINGS

FIG. 7 is a plan view used for setting the area of a liquid-repellent region.

FIG. 8 is shown for explaining a method of forming a pattern according to a conventional printing method.

FIG. 10 is shown for explaining another method of forming a pattern according to the first embodiment.

FIG. 11 is shown for explaining another method of forming a pattern according to the first embodiment.

FIGS. 19A, 19B, 19C, 19D and 19E are shown for explaining a method of forming a pattern according to a fourth embodiment.

FIG. 26 shows a pattern according to an eleventh embodiment.

DETAILED DESCRIPTION

In general, according to one embodiment, a method of forming a pattern comprises preparing a substrate having a liquid-repellent (lyophobic) face and a lyophilic pattern which are located adjacent to each other a surface of the substrate, the lyophilic pattern having a surface energy different from the liquid-repellent face, bringing ink into contact with the substrate, and applying the ink to the lyophilic pattern by moving a contacted ink surface. The lyophilic pattern includes a linear main lyophilic pattern and an auxiliary lyophilic pattern connected to the lyophilic pattern. A liquid-repellent region is defined in the liquid-repellent face between the main lyophilic pattern and the auxiliary lyophilic pattern. In other words, the liquid-repellent region is defined in the liquid-repellent face partitioned with the main lyophilic pattern and the auxiliary lyophilic pattern. The liquid-repellent region is closed by a portion connecting the main lyophilic pattern and the auxiliary lyophilic pattern on an upstream side for a move direction of the ink surface and is open on a downstream side from the connection portion.

In one form of the substrate having the liquid-repellent face and the lyophilic pattern on a surface, the substrate itself has the liquid-repellent face and the lyophilic pattern. In another form, at least one of the liquid-repellent face and the lyophilic pattern is formed on the substrate, using a material different from the substrate. These forms will be described in detail below.

Methods of forming a pattern in various embodiments will be described hereinafter with reference to the accompanying drawings.

(First Embodiment)

Figure 1:
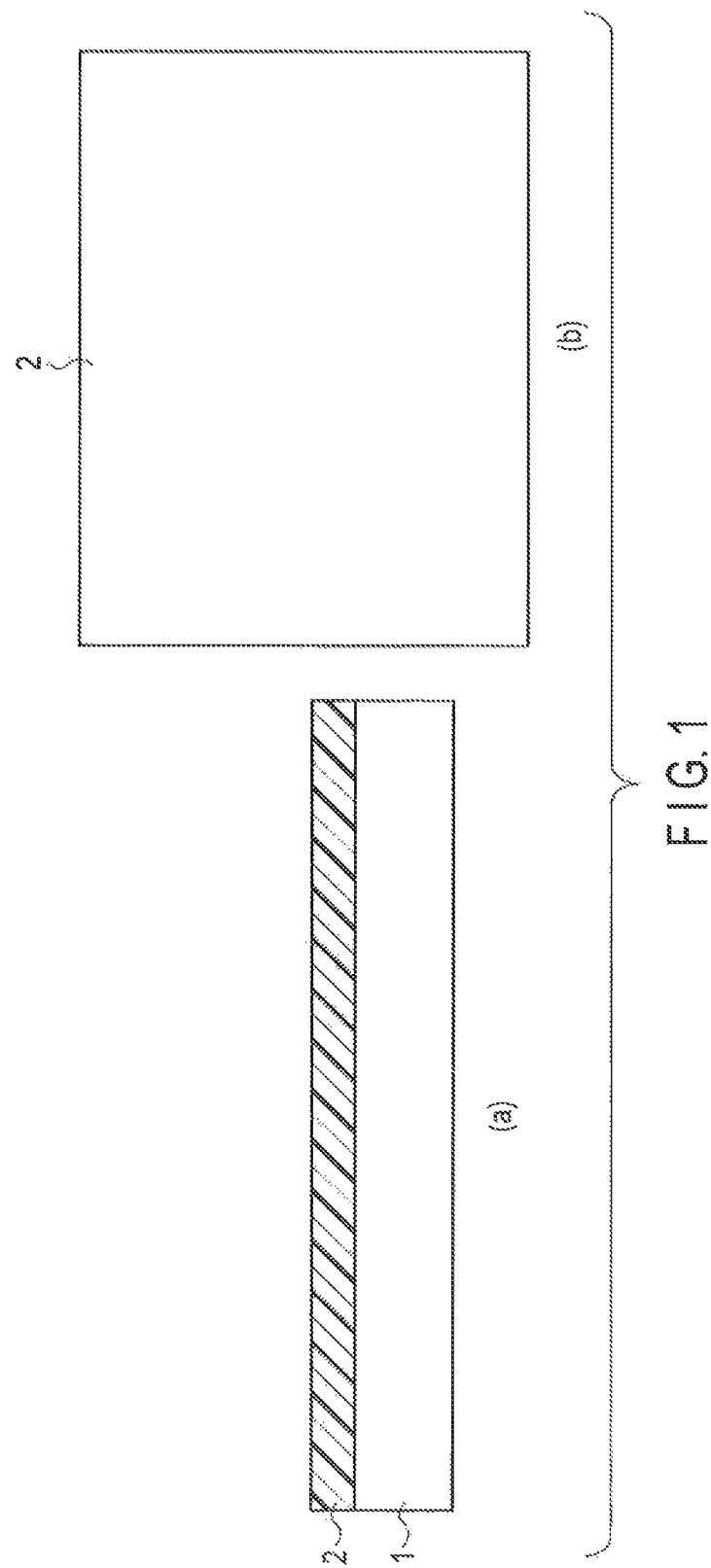
FIG. 1 is shown for explaining a method of forming a pattern according to a first embodiment.

FIG. 1 to FIG. 6 show steps of forming a pattern according to a first embodiment. FIG. 1 (a), FIG. 2 (a), FIG. 3 (a), FIG. 4 (a), FIG. 5 (a) and FIG. 6 (a) are cross-sectional views. FIG. 1 (b), FIG. 2 (b), FIG. 3 (b), FIG. 4 (b), FIG. 5 (b) and FIG. 6 (b) are plan views of FIG. 1 (a), FIG. 2 (a), FIG. 3 (a), FIG. 4 (a), FIG. 5 (a) and FIG. 6 (a), respectively.

(i) As shown in FIGS. 1 (a) and (b), a liquid-repellent layer 2 having a small surface free energy is formed on the surface of a substrate 1.

The substrate may be a single substrate, or a substrate having a surface on which various films or various layers are formed. The substrate itself is made of, for example, glass, a semiconductor material such as silicon, or a plastic film. The films may be, for example, an interlayer insulating film and a gate insulating film. The layers may be, for example, a wire layer, an electrode layer and a semiconductor layer.

The liquid-repellent layer is obtained by, for example, forming an organic resin layer by depositing an organic resin material on the surface of the substrate and then introducing a group including fluorine, a long-chain alkyl group and the like into the surface of the organic resin layer. After forming the organic resin layer, a thin liquid-repellent layer may be formed on the surface of the organic resin layer, or a liquid-repellent layer may be formed by reforming the surface of the organic resin layer through a surface process.

Figure 2:
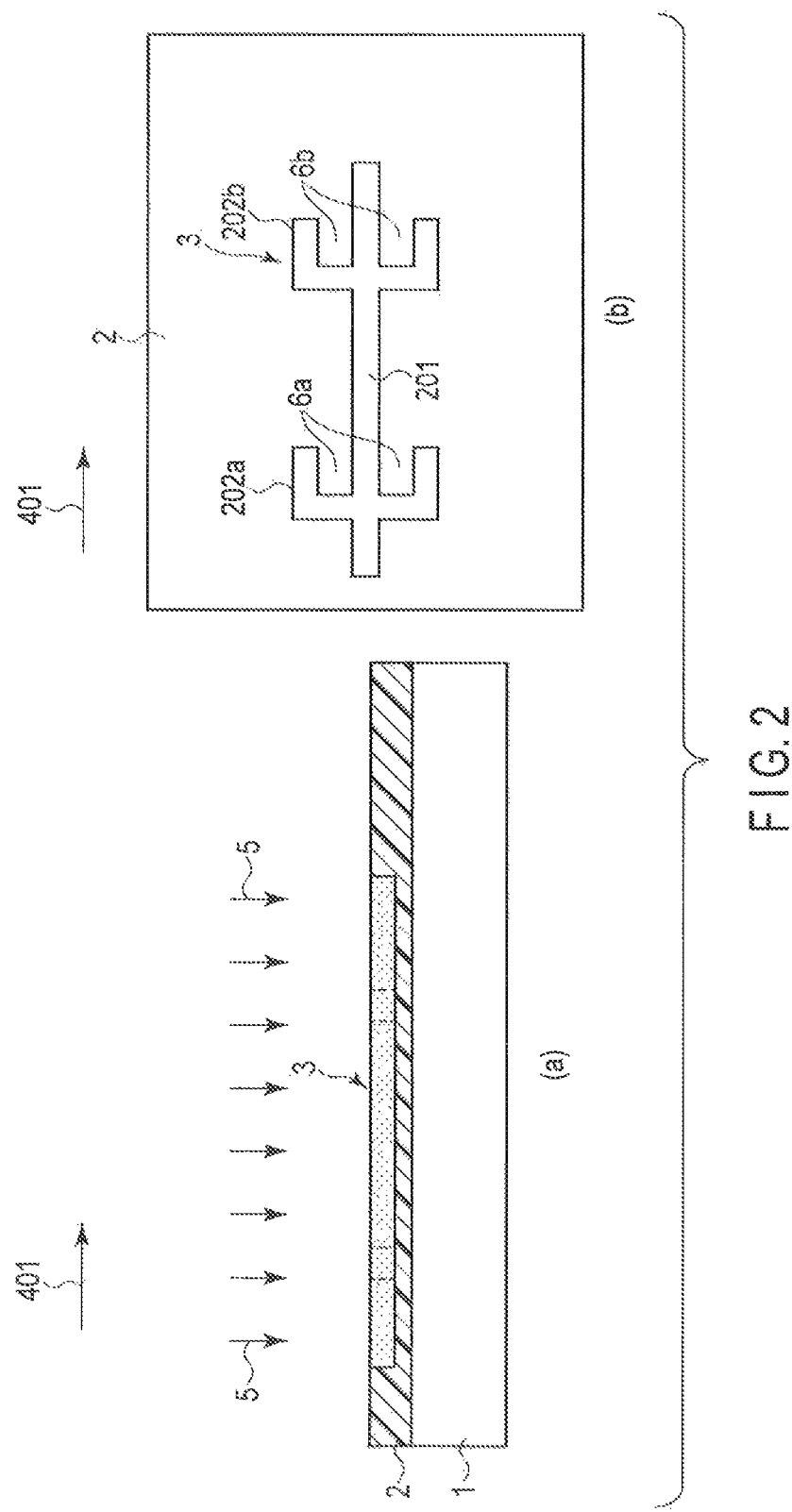
FIG. 2 is shown for explaining the method of forming the pattern according to the first embodiment.

(ii) Subsequently, a lyophilic pattern 3 is formed by irradiating liquid-repellent layer 2 with ultraviolet light 5 as shown in FIGS. 2 (a) and (b). By this step, a liquid-repellent layer 2 and a lyophilic pattern 3 are formed adjacent to each other on a surface of the substrate 1. The liquid-repellent layer 2 has a liquid-repellent which is a large contact angle relative to the ink applied to the surface. The lyophilic pattern 3 has a small contact angle. The contact angle of liquid-repellent layer 2 relative to the application ink is preferably 40 to 120 degrees. The contact angle of lyophilic pattern 3 relative to the ink is preferably smaller than that of liquid-repellent layer 2; specifically, 2 to 25 degrees.

The ultraviolet light may have a short wavelength of 150 to 250 nm or have a wavelength of 350 to 470 nm. As the source of the ultraviolet light, for example, an extra high pressure mercury lamp, an ultraviolet LED or an LD may be employed. One of these light sources may be selected depending on the mechanism of reaction by which the lyophilic pattern is formed.

To form the lyophilic pattern, oxidation by ozone may be applied in combination with irradiation of ultraviolet light. The lyophilic pattern may be formed on a surface of the liquid-repellent layer by reforming the liquid-repellent layer by a selective plasma process using a metal mask. Further, the surface of the liquid-repellent layer may be removed and processed by applying laser ablation to the liquid-repellent layer.

As shown in FIG. 2(b), lyophilic pattern 3 comprises a linear main lyophilic pattern 201 and a plurality of, for example, two auxiliary lyophilic patterns which are a first auxiliary lyophilic pattern 202a and a second auxiliary lyophilic pattern 202b. The two auxiliary lyophilic patterns 202a and 202b of FIG. 2(b) show a part of a plurality of auxiliary lyophilic patterns. In the explanation below, the auxiliary lyophilic patterns and liquid-repellent regions illustrated in the drawings merely show a part of a plurality of auxiliary lyophilic patterns and liquid-repellent regions. Thus, the number of auxiliary lyophilic patterns is not limited to the number illustrated in the drawings. FIG. 2 shows a plurality of auxiliary lyophilic patterns and a plurality of liquid-repellent regions. However, at least one auxiliary lyophilic pattern and one liquid-repellent region should be provided. The first and second auxiliary lyophilic patterns 202a and 202b are connected to the main lyophilic pattern 201, maintaining a desired distance along the main lyophilic pattern 201. The first and second auxiliary lyophilic patterns 202a and 202b have the same shape. For example, each of the first and second auxiliary lyophilic patterns 202a and 202b has a U-shape which is bent at a right angle in two positions in the same direction along the longitudinal direction of the main lyophilic pattern 201. Each of the first and second auxiliary lyophilic patterns 202a and 202b is connected to the main lyophilic pattern 201 in the middle position between the bent portions of the U-shape. Two first liquid-repellent regions 6a are defined in the liquid-repellent layer 2 between the main lyophilic pattern 201 and the first auxiliary lyophilic pattern 202a, respectively. In other words, two the first liquid-repellent regions 6a are defined in two surface portions of the liquid-repellent layer 2 partitioned with the main lyophilic pattern 201 and the first auxiliary lyophilic pattern 202a, respectively. Each of the first liquid-repellent regions 6a has a rectangular shape which is closed by the portion connecting the main lyophilic pattern 201 and the first auxiliary lyophilic pattern 202a on the upstream side for the application direction (the move direction of the ink surface described later) indicated by an arrow 401 from left to right in FIG. 2 (b) and is open on the downstream side from the connection portion. Each of the first liquid-repellent regions 6a is symmetrically formed on both sides of the main lyophilic pattern 201. Two second liquid-repellent regions 6b are defined in the liquid-repellent layer 2 between the main lyophilic pattern 201 and the second auxiliary lyophilic pattern 202b. Each of the second liquid-repellent regions 6b has the same shape as each of the first liquid-repellent regions 6a. In the above explanation, two liquid-repellent regions are formed by one auxiliary lyophilic pattern having a U-shape and a main lyophilic pattern. The two liquid-repellent regions only nave to be a set. Two auxiliary lyophilic patterns each having an L-shape may be prepared, and each of the two L-shaped auxiliary lyophilic patterns and a main lyophilic pattern may form one liquid-repellent region. This explanation is also applied to the description below.

The preferable line width of the first and second auxiliary lyophilic patterns 202a and 202b is equal to or substantially equal to that of the linear main lyophilic pattern 201. However, the first and second auxiliary lyophilic patterns 202a and 202b can achieve their effects when the line width is within the range of 0.2 to 5 times that of the linear main lyophilic pattern 201. More preferably, the line width of the first and second auxiliary lyophilic patterns 202a and 202b is 0.5 times to twice that of the linear main lyophilic pattern 201.

Figures 20A, 20B:
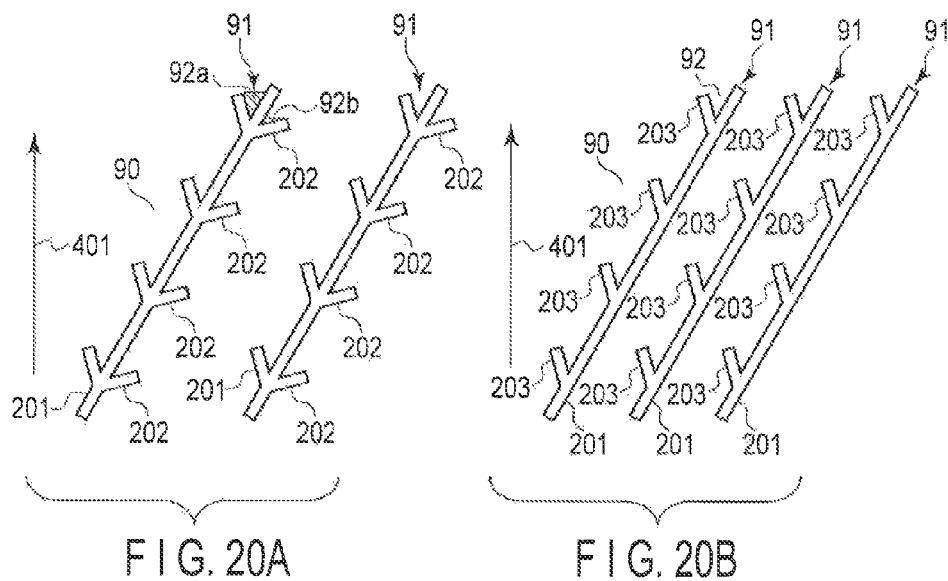
FIGS. 20A and 20B are shown for explaining a method of forming a pattern according to a fifth embodiment.

FIG. 7 shows the lyophilic pattern of FIG. 2(b). The area of the portion of the linear main lyophilic pattern 201 equivalent to one pitch between the first and second auxiliary patterns 202a and 202b is shown by diagonal lines. The area of the first liquid-repellent regions 6a defined in the liquid-repellent layer 2 between the main lyophilic pattern 201 and the first auxiliary lyophilic pattern 202a on the upstream side in the application direction (shown by the arrow 401 in FIG. 7) of the portion of the main lyophilic pattern 201 is shown by diagonal lines opposite of those of the area of the above portion of the main lyophilic pattern 201. The amount of ink applied to the portion of the linear main lyophilic pattern 201 equivalent to one pitch shown by diagonal lines in FIG. 7 is increased based on the area of the first liquid-repellent regions 6a located on the upstream side in the application direction 401 of ink as described later. Therefore, the first liquid-repellent regions 6a preferably have an appropriate area. Specifically, when the area of the portion of the linear main lyophilic pattern 201 is defined as S1, and the area of the first liquid-repellent regions 6a is defined as S2, S2 is preferably greater than or equal to 0.02 times S1. The area of the liquid-repellent regions located on the upstream side in the application direction of ink is the total area of the liquid-repellent regions within one pitch. In FIG. 2(b) and FIG. 7, area 32 of the first liquid-repellent regions is equivalent to the sum of two first liquid-repellent regions 6a shown by diagonal lines. As shown in FIG. 20B explained later, one liquid-repellent region 92 is defined in a liquid-repellent layer 90 between the main lyophilic pattern 201 and each auxiliary lyophilic pattern 203 by connecting the auxiliary lyophilic pattern 203 to one side of the main lyophilic pattern 201. When this form is applied to the area relationship explained in FIG. 7, the area of the liquid-repellent regions is equivalent to the area of one liquid-repellent region 92.

By setting the relationship between the area of the first liquid-repellent region 6a and the area of the portion of the linear main lyophilic pattern 201 in this manner (S2≥0.02S1), the relative film thickness of an ink pattern formed on the main lyophilic pattern 201 can be increased to 1.5 times or greater. S2 is preferably set to satisfy the inequality of $0.02 \times S1 \leq S2 \leq 2 \times S1$. If the pitches differ, calculation may be performed based on the proportion in the total area or the area proportion in the average range. A case in which one auxiliary lyophilic pattern is connected to one main lyophilic pattern is also effective. When the area of the linear main lyophilic pattern is S1, and the area of the liquid-repellent region formed between the main lyophilic pattern and the auxiliary lyophilic pattern is S2, the film thickness of the main lyophilic pattern can be increased by the same setting. In FIG. 2(b), the total area of two second liquid-repellent regions 6b is preferably the same as the total area of two first liquid-repellent regions 6a.

Figure 3:
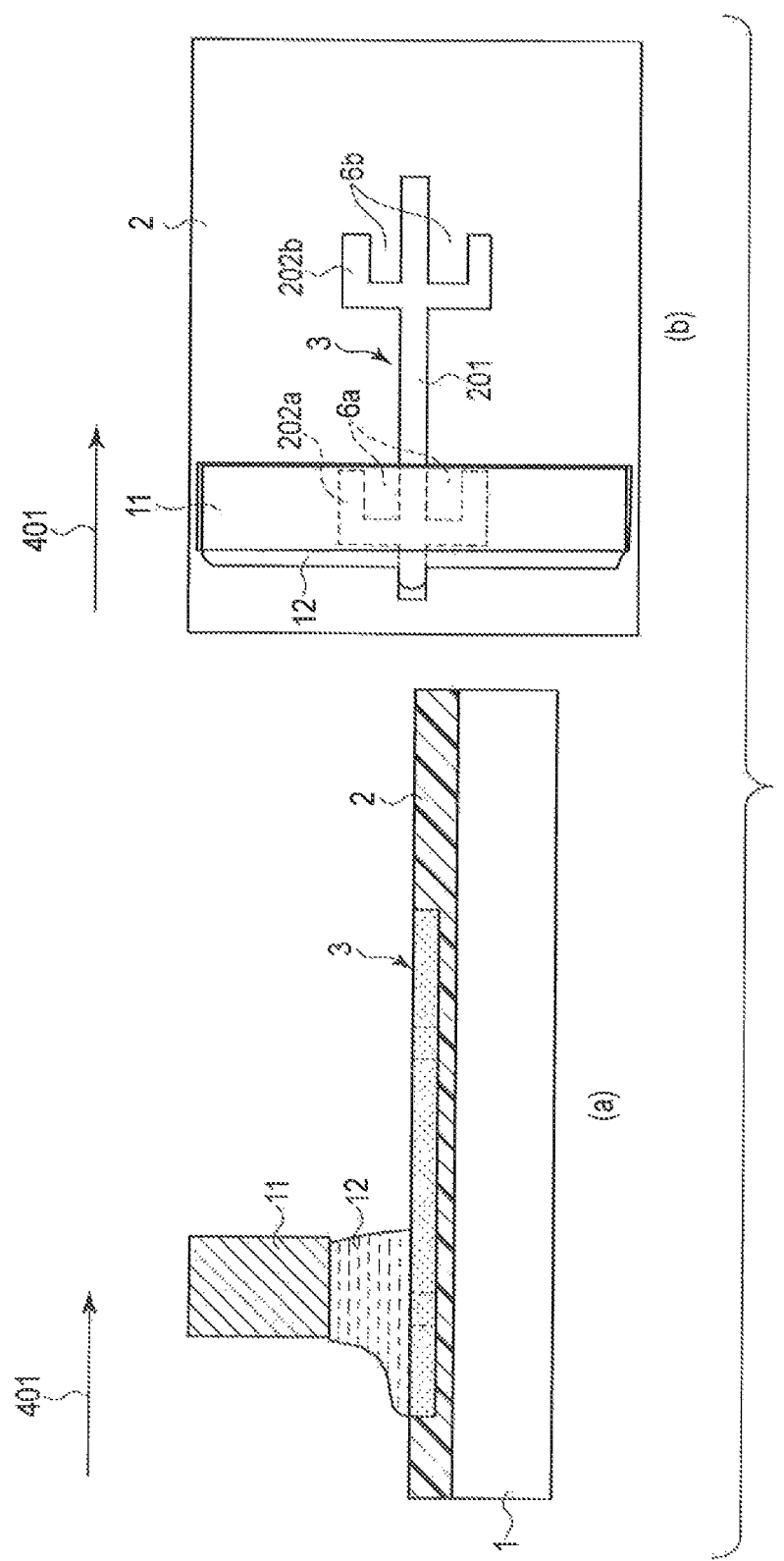
FIG. 3 is shown for explaining the method of forming the pattern according to the first embodiment.

(iii) As shown in FIGS. 3 (a) and (b), an ink retention member 11 is allocated above the surface of liquid-repellent layer 2 on the substrate 1 including lyophilic pattern 3, keeping a predetermined distance from the surface of liquid-repellent layer 2. Ink 12 is retained between the ink retention member 11 and the surface of liquid-repellent layer 2 including lyophilic pattern 3. The distance between the ink retention member 11 and the surface of liquid-repellent layer 2 including lyophilic pattern 3 is preferably 10 to 500 µm.

As the ink retention member, for example, an applicator formed of metal or glass can be used. The applicator may comprise a nozzle configured to supply ink. The ink retention member may have a capillary structure. In the capillary structure, the ink retention member is retained with a narrow gap relative to the surface of the liquid-repellent layer including the lyophilic pattern. Ink is filled or supplied into the gap.

Various types of materials can be used for ink such as a conductive material, a semiconductor material and an insulating material. When ink is applied using the ink retention member, the ink preferably has a suitable viscosity for formation of a pattern having a sufficient thickness through the movement of the meniscus surface and the accumulation of the ink in the liquid-repellent region. The viscosity of the ink is preferably 1 to 100 mPa·s and is more preferably 2 to 30 mPa·s.

As conductive ink, for example, a dispersed system in which metal nanoparticles such as Ag, Au and Cu are dispersed, a simple substance such as carbon nanotubes or fullerenes or a mixed dispersion system, a sol-gel material or a complex solution can be used. Examples of a solvent include water, or an organic solvent. Examples of the organic solvent include water, and alcohol, tetradecane, propylene glycol monomethyl ether acetate (PGMEA), toluene, mesitylene or tetralin, or a mixed solution thereof. As conductive ink, in addition to metal and a conductive material, for example, a solution dissolved in a dispersion element or a solvent such as a macromolecular or low-molecular organic semiconductor, an inorganic semiconductor, an organic resin or an inorganic insulating material can be used. The conductive ink may further contain, for example, an aggregation inhibition agent, a drying inhibition agent and a surface-active agent.

Figure 4:
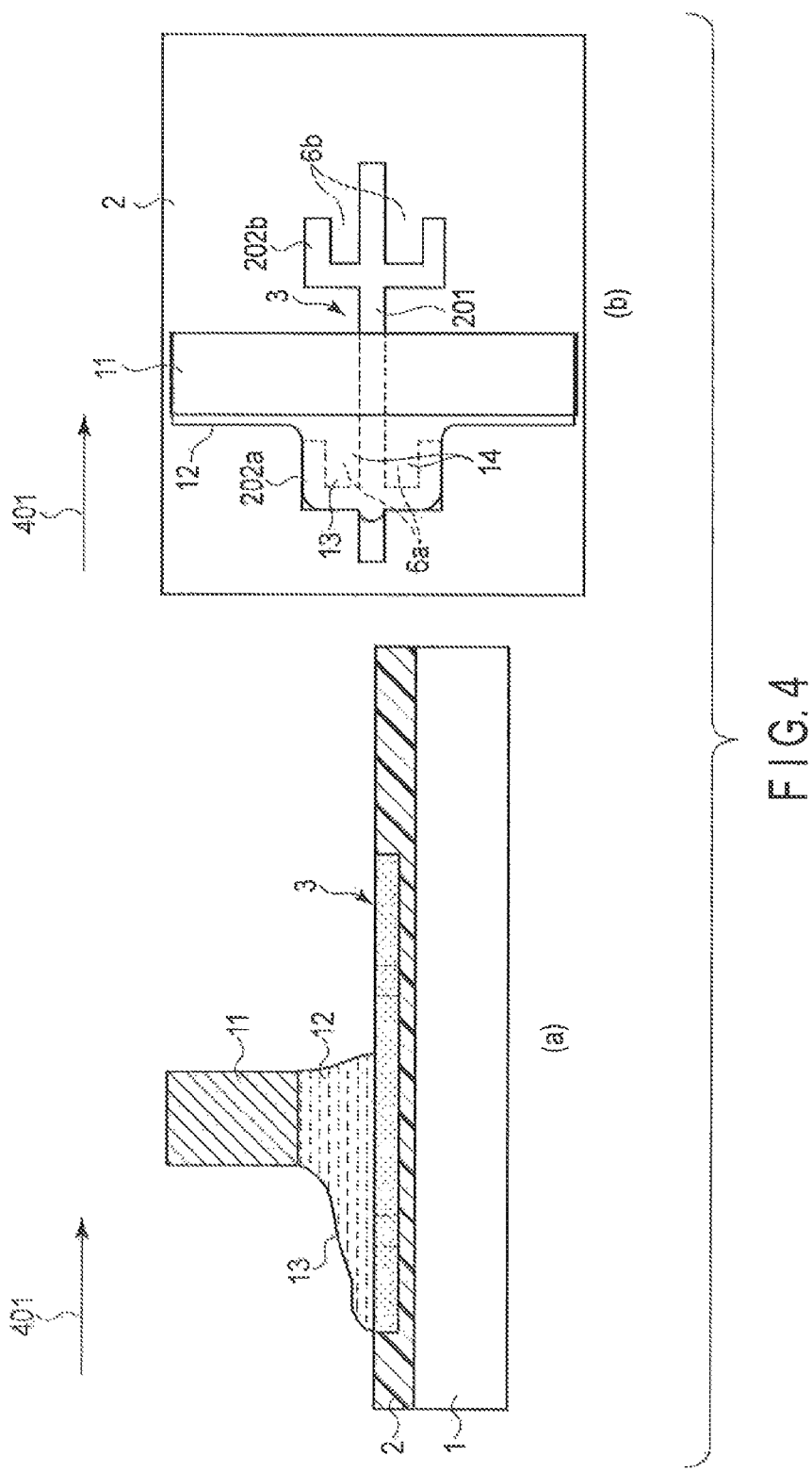
FIG. 4 is shown for explaining the method of forming the pattern according to the first embodiment.

(iv) As shown in FIGS. 4 (a) and (b), the retained ink 12 is moved onto the substrate 1. The ink 12 is moved by moving the ink retention member 11 relative to the substrate 1 or by moving the substrate 1 with the ink retention member 1 being fixed. The ink is moved in the application direction indicated by the arrow 401. In the aforementioned FIGS. 3(a) and (b), the end portion of lyophilic pattern 3 on the upstream side is the start position of application. A meniscus surface 13 of the ink 12 is moved on the substrate 1, thereby applying the ink. The ink 12 is moved in the direction of the arrow 401 together with the ink retention member 11. When the ink 12 went beyond the first auxiliary lyophilic pattern 202a, an ink accumulation region 14 is formed in each of the two first liquid-repellent regions 6a which are defined in the liquid-repellent layer 2 between the main lyophilic pattern 201 and the first auxiliary lyophilic pattern 202a. The ink accumulation regions 14 are also formed as the sum of two first liquid-repellent regions 6a.

When the viscosity of the ink is, for example, 2 to 30 mPa·s as described above, the moving speed of the ink is preferably 1 to 1000 cm/minute. More preferably, the moving speed of the ink is 1.0 to 200 cm/minute. The application method may be, for example, a die coating method, a slit coating method or a dip method.

Figure 5:
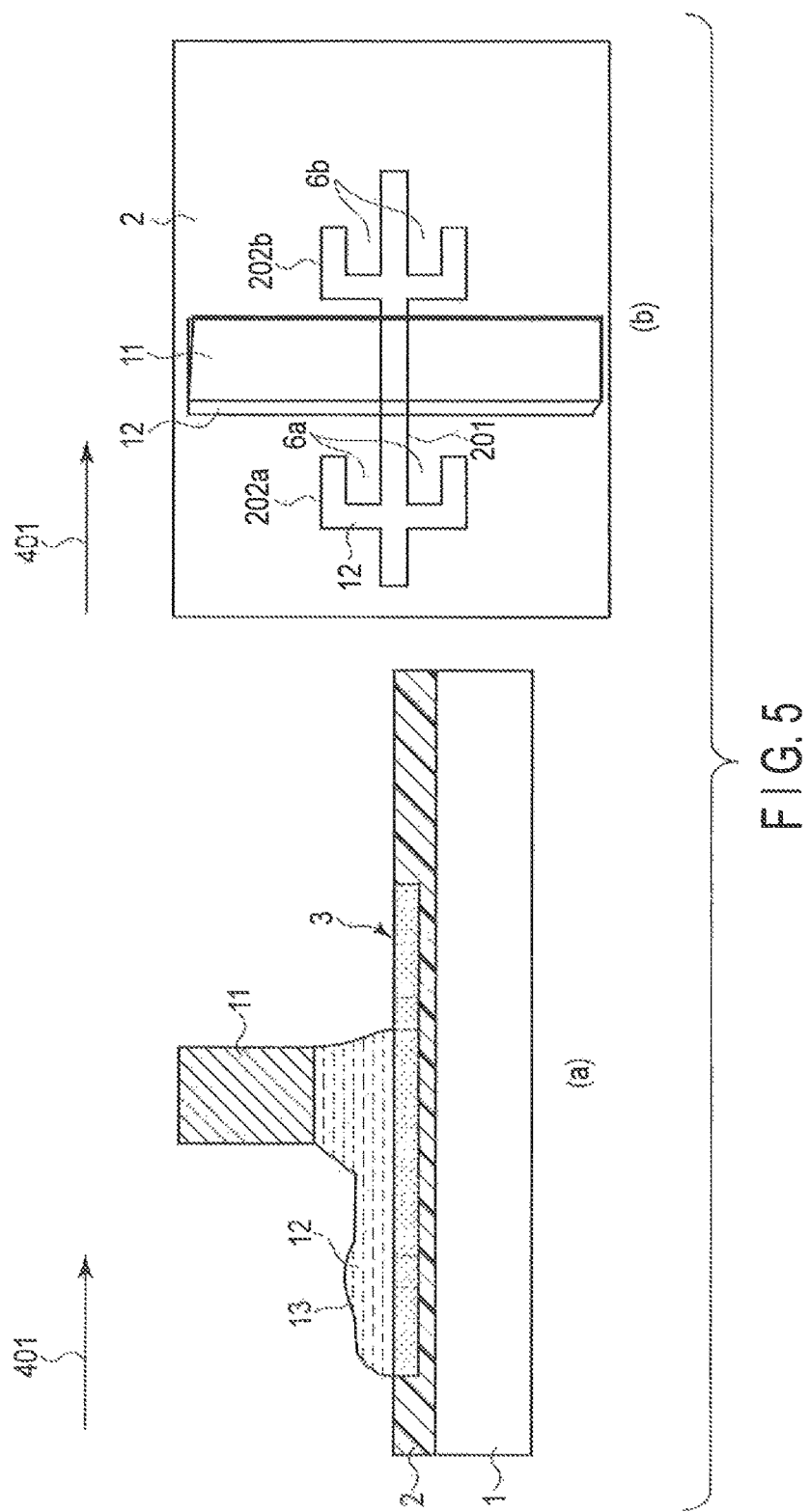
FIG. 5 is shown for explaining the method of forming the pattern according to the first embodiment.

(v) The ink retention member 11 is further moved in the direction of the arrow 401. When the ink retention member 11 is positioned between the first and second auxiliary lyophilic patterns 202a and 202b of lyophilic pattern 3 as shown in FIGS. 5 (a) and (b), the ink is selectively attached to the portion of the main lyophilic pattern 201 located on the upstream side of the ink retention member 11 and the first auxiliary lyophilic pattern 202a as a result of the move of the meniscus surface 13. At this time, the ink in the ink accumulation regions 14 formed in the two first liquid-repellent regions 6a is moved to the portion of the main lyophilic pattern 201 located on the downstream side of the ink retention member 11. Thus, it is possible to increase the ink amount on the portion of the linear main lyophilic pattern 201. Strictly, in addition to the downstream side of the main lyophilic pattern, the ink is moved on the upstream side connected as liquid. The ultimate distribution of the thickness of ink is not determined by the mechanical equilibrium status due to surface tension. The ultimate distribution of the thickness of ink is determined by the viscosity or the drying speed of ink, etc. In either case, the ink amount on the main lyophilic pattern can be increased by connecting the auxiliary lyophilic patterns to the main lyophilic pattern as shown in the present embodiment.

Figure 6:
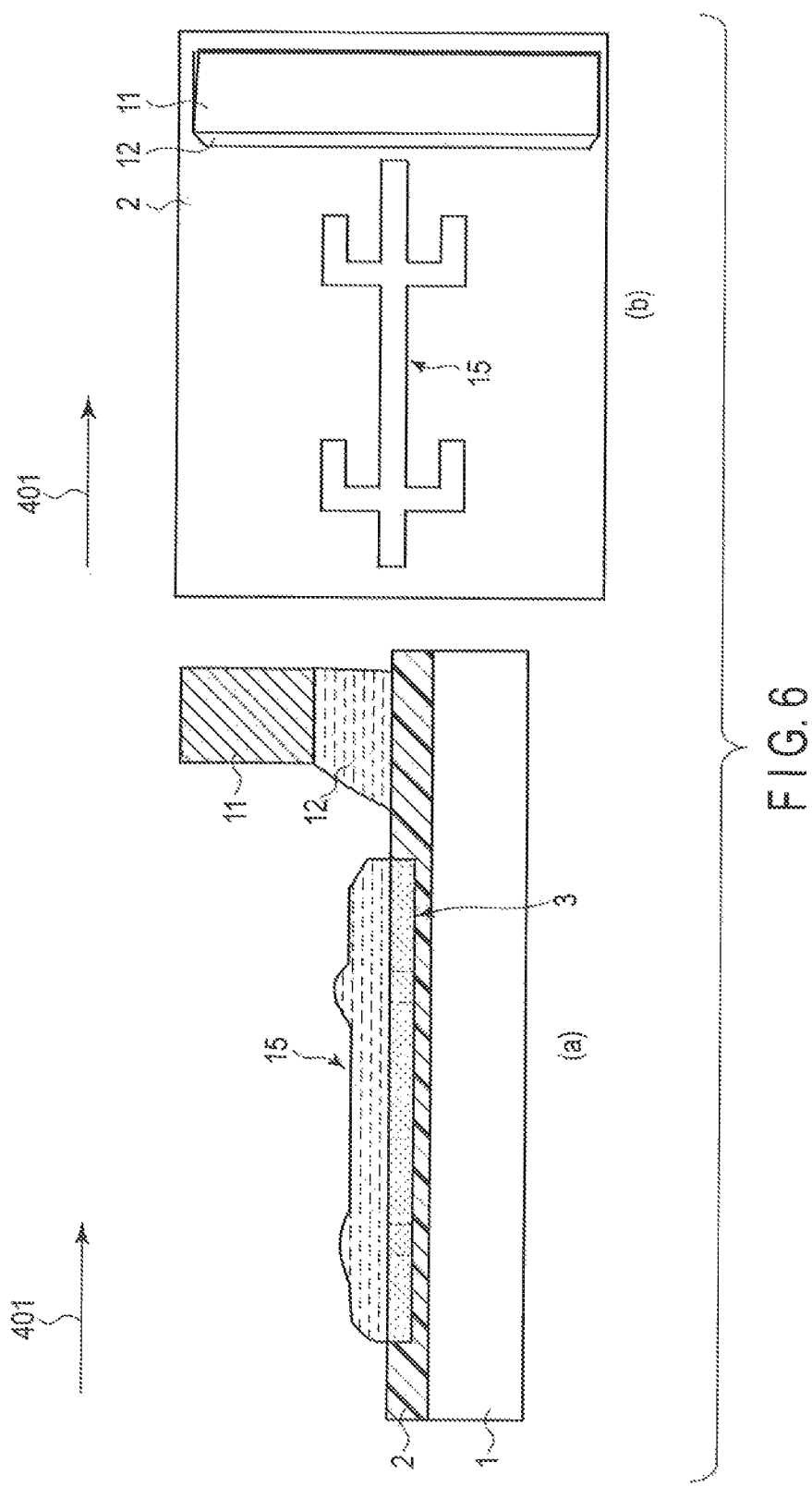
FIG. 6 is shown for explaining the method of forming the pattern according to the first embodiment.

(vi) The ink retention member 11 is further moved in the direction of the arrow 401 and passes the second auxiliary lyophilic pattern 202b of lyophilic pattern 3. When the ink retention member 11 is positioned on the right side as shown in FIGS. 6 (a) and (b), the ink is selectively attached to the portion of the main lyophilic pattern 201 located on the upstream side of the ink retention member 11 and the second auxiliary lyophilic pattern 202b as a result of the move of the meniscus surface 13. When the ink 12 went beyond the second auxiliary lyophilic pattern 202b after the move in the direction of the arrow 401 together with the ink retention member 11, an effect similar to that of FIGS. 4 (a) and (b) is exerted, thereby forming ink accumulation region (not shown) in the second liquid-repellent region 6b formed on the liquid-repellent layer 2 between the main lyophilic pattern 201 and the second auxiliary lyophilic pattern 202b. The ink in the ink accumulation region formed in the second liquid-repellent regions 6b is moved to the portion of the main lyophilic pattern 201 located on the downstream side of the ink retention member 11, in other words, located on the move direction side beyond the second auxiliary lyophilic pattern 202b. Thus, the ink amount on the portion of the linear main lyophilic pattern 201 can be increased.

According to the first embodiment explained in step (i) to step (vi), when the ink 12 went beyond the first auxiliary lyophilic pattern 202a after the move in the direction of the arrow 401 together with the ink retention member 11, the ink accumulation regions 14 are formed in the first liquid-repellent regions 6a, respectively. Subsequently, the ink 12 is further moved together with the ink retention member 11. When the ink 12 went beyond the second auxiliary lyophilic pattern 202b, ink accumulation regions (not shown) is formed in the two second liquid-repellent regions 6b, respectively. As a result, the ink in each ink accumulation region is supplied to the portion of the linear main lyophilic pattern 201 located on the downstream side in the move direction separately from the ink supplied from the ink retention member 11. Thus, the ink amount on the portion of the main lyophilic pattern 201 can be increased. In this manner, a thick ink pattern 15 can be formed on the linear main lyophilic pattern 201 (see FIGS. 6 (a) and (b)).

As shown in FIGS. 8 (a) and (b), a liquid-repellent layer 302 and a linear lyophilic pattern 303 are formed. Liquid-repellent layer 302 has a large contact angle relative to the ink applied to the surface of a substrate 301. The linear lyophilic pattern 303 has a small contact angle relative to the ink and does not comprise an auxiliary lyophilic pattern. After forming liquid-repellent layer 302 and lyophilic pattern 303, an ink pattern 304 is formed on the linear lyophilic pattern 303, using the ink retention member in accordance with the above steps (iii) to (vi). The ink pattern 15 shown in FIGS. 6(a) and (b) according to the first embodiment is compared with the ink pattern 304 shown in FIGS. 8 (a) and (b). As a result, it is confirmed that the film thickness of the ink pattern 15 shown in FIGS. 6(a) and (b) according to the first embodiment is dramatically greater than that of the ink pattern 304 shown in FIGS. 8 (a) and (b).

In the first embodiment, a thick pattern can be formed by solidifying (or curing) the ink pattern 15 through application of a process such as drying, heating, baking, light irradiation or plasma irradiation. The curing temperature is selected depending on the ink composition. For example, when the conductive ink of a dispersion system in which metal nanoparticles such as Ag, Au or Cu are dispersed is used, the curing temperature is preferably 100 to 300° C. and is more preferably 120 to 180° C.

According to the method of the first embodiment, it is possible to ensure a sufficient film thickness relative to a fine pattern when the pattern is formed by applying ink to the substrate in which the difference of surface free energy is formed in the plane in advance.

Next, an Example of the method of forming a conductive pattern according to the first embodiment and a Comparative Example of the method of forming a conductive pattern will be described hereinafter with reference to FIGS. 9 (A) and (B), respectively.

(EXAMPLE 1)

Aqueous ink having a viscosity of 10 mPa·s in which Ag nanoparticles having a particle diameter of 20 nm on average are dispersed (hereinafter, referred to as Ag nanoparticles dispersion aqueous ink) is prepared. Subsequently, liquid-repellent layer 2 and two lyophilic patterns 3 are formed adjacent to each other on the surface of the glass substrate. The contact angle of liquid-repellent layer 2 relative to the Ag nanoparticles dispersion aqueous ink is 90 degrees. The contact angle of the two lyophilic patterns 3 relative to the Ag nanoparticles dispersion aqueous ink is 10 degrees (see FIG. 9(A)).

Figures 9A, 9B:
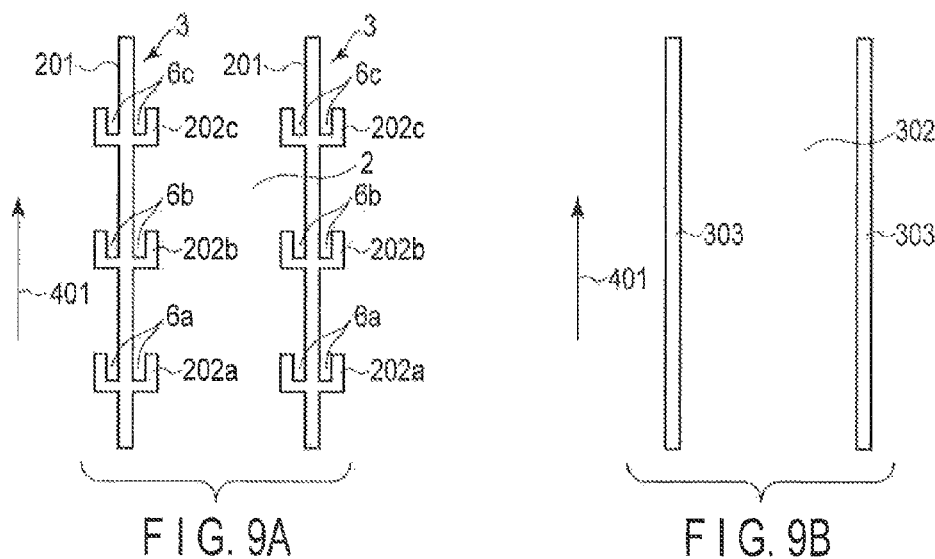
FIGS. 9A, 9B and 9C are shown for explaining an Example 1 and a Comparative Example 1.

Each lyophilic pattern 3 comprises the linear main lyophilic pattern 201 having a length of 2000 μm and a width of 20 μm, and three auxiliary lyophilic patterns connected to the main lyophilic pattern 201 in a pitch of 200 μm along the longitudinal direction of the main lyophilic pattern 201, respectively. In FIG. 9(A), a part of the lyophilic patterns 3 is enlarged. Three auxiliary lyophilic patterns shown in FIG. 9(A) are the first auxiliary lyophilic pattern 202a, the second auxiliary lyophilic pattern 202b and a third auxiliary lyophilic pattern 202c. Each of the auxiliary lyophilic patterns 202a to 202c has a U-shape which is bent at 90 degrees in two positions in the longitudinal direction of the main lyophilic pattern 201. The middle position between the bent portions is connected to the main lyophilic pattern 201. In each of the auxiliary lyophilic patterns 202a to 202c, the width is 20 μm; the length of the linear portion connected to the main lyophilic pattern 201 is 40 μm; and the length of two bent linear portions is 40 μm. Two first liquid-repellent regions 6a are defined in the liquid-repellent layer 2 between the main lyophilic pattern 201 and the first auxiliary lyophilic pattern 202a, respectively. Each of the first liquid-repellent regions 6a is closed by the portion connecting the main lyophilic pattern 201 and the first auxiliary lyophilic pattern 202a on the upstream side for the application direction indicated by the arrow 401 from bottom to top as shown in FIG. 9(A), and is open on the downstream side from the connection portion. The two first liquid-repellent regions 6a are symmetrically formed on both sides of the main lyophilic pattern 201. Two second liquid-repellent regions 6b are defined in the liquid-repellent layer 2 between the main lyophilic pattern 201 and the second auxiliary lyophilic pattern 202b. Two third liquid-repellent regions 6c are formed on the liquid-repellent layer 2 between the main lyophilic pattern 201 and the third auxiliary lyophilic pattern 202c. The two second liquid-repellent regions 6b and the two third liquid-repellent regions 6c have the same shape as the two first liquid-repellent regions 6a.

Subsequently, conductive ink patterns are formed on lyophilic patterns 3 by means of the ink retention member, using the Ag nanoparticles dispersion aqueous ink in accordance with the above steps (iii) to (vi). When the conductive ink patterns are formed, the distance between the ink retention member 11 and the surface of liquid-repellent layer 2 including lyophilic pattern 3 is set to 100 μm, and further, the moving speed of the ink is set to 100 cm/minute. Subsequently, the conductive ink patterns are cured at 150° C. to form conductive patterns made of Ag nanoparticles.

(COMPARATIVE EXAMPLE 1)

In a manner similar to that of practical example 1, liquid-repellent layer 302 whose contact angle relative to the Ag nanoparticles dispersion aqueous ink is 90 degrees, and the linear lyophilic pattern 303 whose contact angle relative to the Ag nanoparticles dispersion aqueous ink is 10 degrees are formed adjacent to each other on the surface of the glass substrate (see FIG. 9(B)). Lyophilic pattern 303 does not comprise an auxiliary lyophilic pattern unlike FIG. 9(A) of Example 1. Lyophilic pattern 303 has a linear shape having a length of 2000 μm and a width of 20 μm. Subsequently, a conductive ink pattern is formed on the linear lyophilic pattern 303 under the same application conditions as Example 1, using the Ag nanoparticles dispersion aqueous ink and the ink retention member in accordance with the above steps (iii) to (vi). Subsequently, the conductive ink pattern is cured at 150° C. to form conductive pattern made of the Ag nanoparticles.

The film thickness of each of the obtained conductive patterns of Example 1 and Comparative Example 1 is measured. The film thickness of the conductive pattern of Example 1 is calculated based on a relative film thickness where the film thickness of the conductive pattern of Comparative Example 1 is set to one. The result is shown in FIG. 9(C).

Figure 9C:
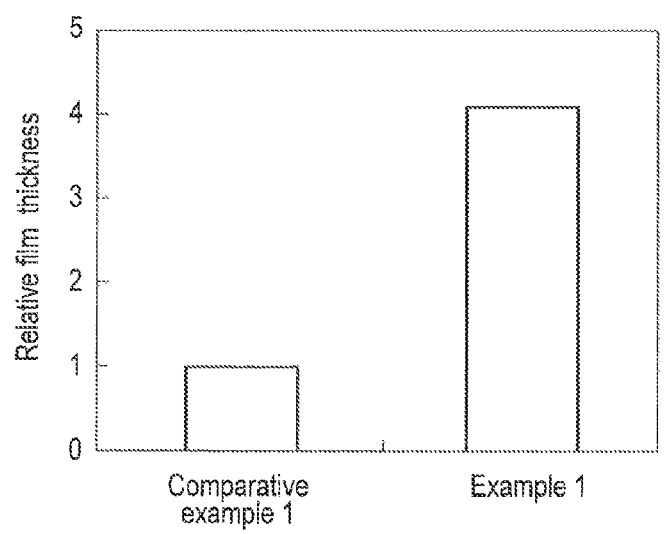

As is clear from the result of FIG. 9(C), the relative film thickness of the conductive pattern of Example 1 formed using lyophilic pattern 3 comprising auxiliary lyophilic patterns 202a, 202b and 202c is approximately four times that of the conductive pattern of Comparative Example 1 formed using lyophilic pattern 303 which does not comprise an auxiliary lyophilic pattern even when the conductive pattern of practical example 1 has a fine width of 20 μm.

With regard to the resistance of a conductive pattern, the sheet resistance can be calculated from the line width and the line length by measuring the resistance between both ends of the linear conductive pattern portion. Assuming that the electric conductivity of the film is constant, the inverse of the sheet resistance is proportionate to the film thickness of the conductive pattern. It is possible to evaluate a film thickness which is average and effective by the inverse of the sheet resistance. By this evaluation, the conductive pattern of Example 1 shows a low sheet resistance which is one-fourth of the conductive pattern of Comparative Example 1.

When ink is applied in a direction (from the upper to lower part of the paper plane) opposite to the application direction shown in FIG. 9(A), the relative film thickness is equal to or slightly less than the result of Comparative Example 1. It is confirmed that the application direction should maintain a certain relationship with the orientation (particularly, the opening position) of the liquid-repellent region defined in the liquid-repellent layer between the main lyophilic pattern and the auxiliary lyophilic pattern to obtain the effect of increase in the film thickness.

When the width of the linear main lyophilic pattern in the lyophilic pattern is less than or equal to 30 μm, in particular, 20 μm, the ink amount applied to the main lyophilic pattern by application is decreased. Thus, the method of forming a pattern of the first embodiment has a larger effect in the application of the main lyophilic pattern having the narrow width. If the width of the main lyophilic pattern is less than or equal to 20 μm, and the pattern has a narrow portion, in particular, a portion decreased by half or greater in the width, the ink amount on the linear main lyophilic pattern may be reduced in ink application. By a method of providing an auxiliary lyophilic pattern like the first embodiment, it is possible to form a pattern which is sufficiently thick even if the pattern has a narrow portion.

Now, another method of forming a pattern will be described hereinafter with reference to FIGS. 10 (a) and (b), FIGS. 11 (a) and (b) and FIGS. 12 (a) and (b).

As shown in FIGS. 10 (a) and (b), a based resin layer 22 is formed on a substrate 21. The materials of the based resin layer may be, for example, materials of polystyrene series, polyimide series, acrylic series and partial fluorine series, hardening resin hardened by heat, light or plasma, or photosensitive resin containing a photosensitive material. For example, the photosensitive resin may contain a photoacid-generating agent, have photocuring properties, or obtain developing resistance properties by photo polymerization.

Subsequently, as shown in FIGS. 11 (a) and (b), a liquid-repellent layer 23 is formed on the based resin layer 22. The contact angle of the used liquid-repellent layer relative to conductive ink is large at 70 degrees or greater.

As the liquid-repellent layer, for example, a liquid-repellent layer of fluorine series is preferably formed by causing gas containing discharged and dissolved fluorine to react on the surface of the based resin layer 21. The gas containing fluorine is preferably a fluorocarbon, and may be $CF_4$, $C_4F_8$, $CHF_3$, etc. By using this type of gas, it is possible to form a liquid-repellent layer whose contact angle relative to water is greater than or equal to 95 degrees. Apart from the method of forming a liquid-repellent layer on the surface of the based resin layer by making gas containing fluorine subjected to plasma, a liquid-repellent layer may be formed by applying a solution of a material containing fluorine to the surface of the based resin layer. Amorphous fluorine resin can be also used as a liquid-repellent layer.

Figure 12:
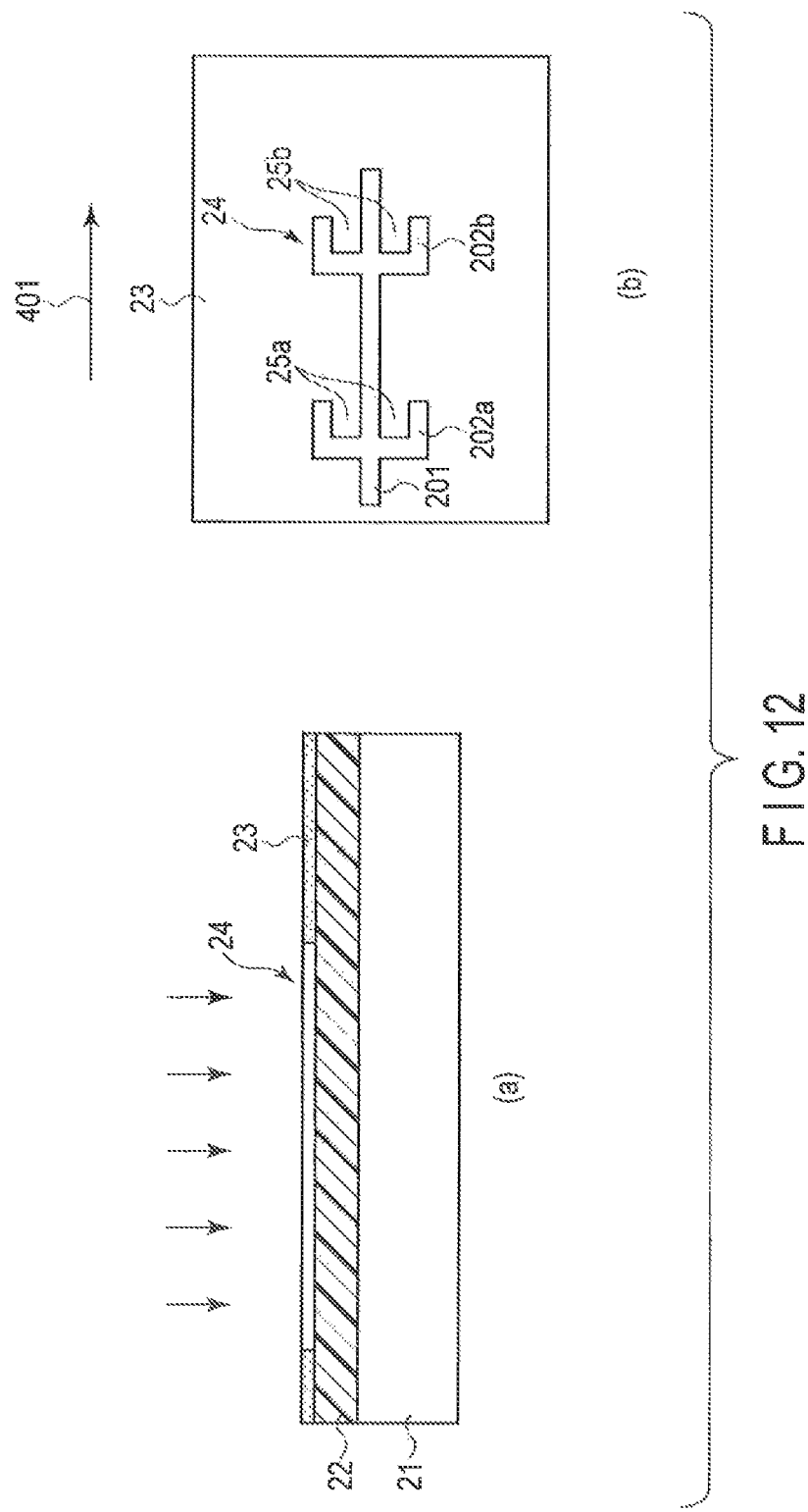
FIG. 12 is shown for explaining another method of forming a pattern according to the first embodiment.

Subsequently, as shown in FIGS. 12 (a) and (b), the surface of the based resin layer 22 is exposed by selectively removing liquid-repellent layer 23. In this manner, a concave lyophilic pattern 24 is formed. A lyophilic pattern 24 comprises, as described above, the linear main lyophilic pattern 201 and two auxiliary lyophilic patterns which are connected to the main lyophilic pattern 201 with a desired distance along the main lyophilic pattern 201. The two auxiliary lyophilic patterns are a first auxiliary lyophilic pattern 202a and a second auxiliary lyophilic pattern 202b. The first and second auxiliary lyophilic patterns 202a and 202b have the same shape, and for example, have a U-shape which is bent at 90 degrees in two positions in the longitudinal direction of the main lyophilic pattern 201. The middle position between the bent portions is connected to the main lyophilic pattern 201. Two first liquid-repellent regions 25a are defined in the liquid-repellent layer 23 between the main lyophilic pattern 201 and the first auxiliary lyophilic pattern 202a, respectively. In other words, two the first liquid-repellent regions 25a are defined in two surface portions of the liquid-repellent layer 23 partitioned with the main lyophilic pattern 201 and the first auxiliary lyophilic pattern 202a, respectively. Each of the first liquid-repellent regions 6a is closed by the portion connecting the main lyophilic pattern 201 and the first auxiliary lyophilic pattern 202a on the upstream side in the application direction shown by the arrow 401 from left to right in FIG. 12 (b) and is open on the downstream side from the connection portion. Two second liquid-repellent regions 25b are defined in the liquid-repellent layer 23 between the main lyophilic pattern 201 and the second auxiliary lyophilic pattern 202b. The two second liquid-repellent regions 25b have the same shape as the two first liquid-repellent regions 6a.

The depth of the concave lyophilic pattern is equivalent to the thickness of the liquid-repellent layer. If the lyophilic pattern is deepened, in other words, if the liquid-repellent layer is thickened, the time required to form the liquid-repellent layer on the based resin layer is lengthened, and further, the time required to remove the liquid-repellent layer so as to expose the surface of the based resin layer 22 is lengthened. On the other hand, if the lyophilic pattern excessively shallows, in other words, if the liquid-repellent layer is excessively thinned, the liquid-repellent properties of the liquid-repellent layer might be impaired. Thus, the thickness of the liquid-repellent layer is preferably 10 to 100 nm, and the depth of the concave lyophilic pattern is preferably 10 to 100 nm so as to be equivalent to the thickness of the liquid-repellent layer.

Laser ablation is suitable as a method of selectively removing the liquid-repellent layer. In laser ablation, an excimer laser having a short wavelength is used as the light source to, for example, form an etching pattern by an optical system or draw an etching pattern through an optical modulation element. In this manner, a predetermined pattern is irradiated to the liquid-repellent layer. As the light source, for example, a KrF excimer laser having a wavelength of 248 nm can be used.

To selectively remove the liquid-repellent layer, a method of applying a resist onto the liquid-repellent layer, exposing and developing the resist to form a resist pattern, and selectively removing the liquid-repellent layer with oxygen plasma, etc., using the resist pattern as a mask can be also applied. To expose the resist, a direct drawing exposure device or a magnification conversion projection exposure device, which measures the substrate deformation and performs correction exposure, may be used. If a photosensitive material of fluorine series having lyophilic process resistance characteristics such as UV ozone resistance characteristics or plasma resistance characteristics is used as the resist, the resist pattern formed of the photosensitive material of fluorine series can be left as the liquid-repellent layer without exfoliation after the liquid-repellent layer is selectively removed by the resist pattern. Thus, the step of exfoliating the resist pattern can be omitted. Further, the resist pattern can be used as a part of the liquid-repellent layer.

If a photosensitive material of fluorine series having lyophilic process resistance characteristics such as UV ozone resistance characteristics or plasma resistance characteristics is used, it is possible to form a pattern equivalent to the liquid-repellent layer by exposing and patterning photosensitive resin without forming the liquid-repellent layer in advance. Subsequently, the lower resin layer can be made lyophilic by applying, for example, a UV/O$_3$ process to the resin layer, using the pattern as a mask.

For the based resin layer 22, a material which absorbs irradiated laser and is ablated is preferably selected from the aforementioned materials. The material of the based resin layer itself preferably has a small contact angle relative to ink. However, even if the material of the based resin layer has a large contact angle relative to ink, the based resin layer portion exposed from the liquid-repellent layer can be made lyophilic by applying a UV/O$_3$ process to the liquid-repellent layer through the liquid-repellent layer as a mask. The liquid-repellent layer of fluorine series is highly resistant to UV light having a wavelength of 185 nm of a low pressure mercury lamp and generated ozone. Therefore, the liquid-repellent properties can be maintained even during the process in which the based resin layer 22 is made lyophilic. As the lyophilic process, a plasma process or deep UV light irradiation may be employed.

After the above steps, ink (for example, conductive ink) is applied to lyophilic pattern 24. This process of applying ink may be conducted in accordance with the above steps (iii) to (vi). When ink is applied by an applicator, capillary coating or die coating, the first and second auxiliary lyophilic patterns 202a and 202b function to increase the ink amount applied to the main lyophilic pattern 201. Thus, it is possible to form a thick ink pattern (for example, a thick conductive ink pattern). Subsequently, the ink pattern is dried, heated, cured or subjected to light irradiation or plasma irradiation, etc., to be solidified. In this manner, a thick pattern can be formed.

When the pattern (for example, the conductive pattern) formed by the above method is applied to formation of interconnections, it is possible to form low-resistance interconnections. Thus, interconnection delay or voltage depression can be prevented. In particular, when nanoparticles dispersion aqueous ink is used, and the film thickness is less than or equal to 50 nm after curing, the resistivity is rapidly increased from the grain diameter of nanoparticle. Thus, the resistance becomes high to such an extent that disconnection is caused. However, in the method of forming a pattern according to the first embodiment, low-resistance interconnections can be formed while maintaining a thick film. Thus, for example, disconnection can be avoided.

In an embodiment using aqueous conductive ink, when resin of polystyrene series is used as lyophilic material, it takes place the effect by the lyophilic surface state. For example, when the film thickness may be less than or equal to 100 nm, the resistivity may be markedly increased. Even in this case, the increase in the ink amount on the lyophilic pattern in the application step has a great effect similarly to the first embodiment.

As shown in FIGS. 12 (a) and (b), the lyophilic pattern formed by selectively removing liquid-repellent layer 23 has a concave shape. Thus, the ink retention properties can be improved in the application step.

In the above description, a liquid-repellent layer is made lyophilic in formation of a lyophilic pattern. However, a lyophilic pattern may be formed by selectively making a lyophilic layer liquid-repellent. Thus, any process can be applied to the method of forming a liquid-repellent layer and a lyophilic pattern on the substrate by using a liquid-repellent material or a lyophilic material.

The first embodiment is especially suitable for formation of a conductive pattern. However, the first embodiment can be also applied to, for example, a semiconductor pattern, an insulating pattern and an optical pattern.

(Second Embodiment)

Figure 13:
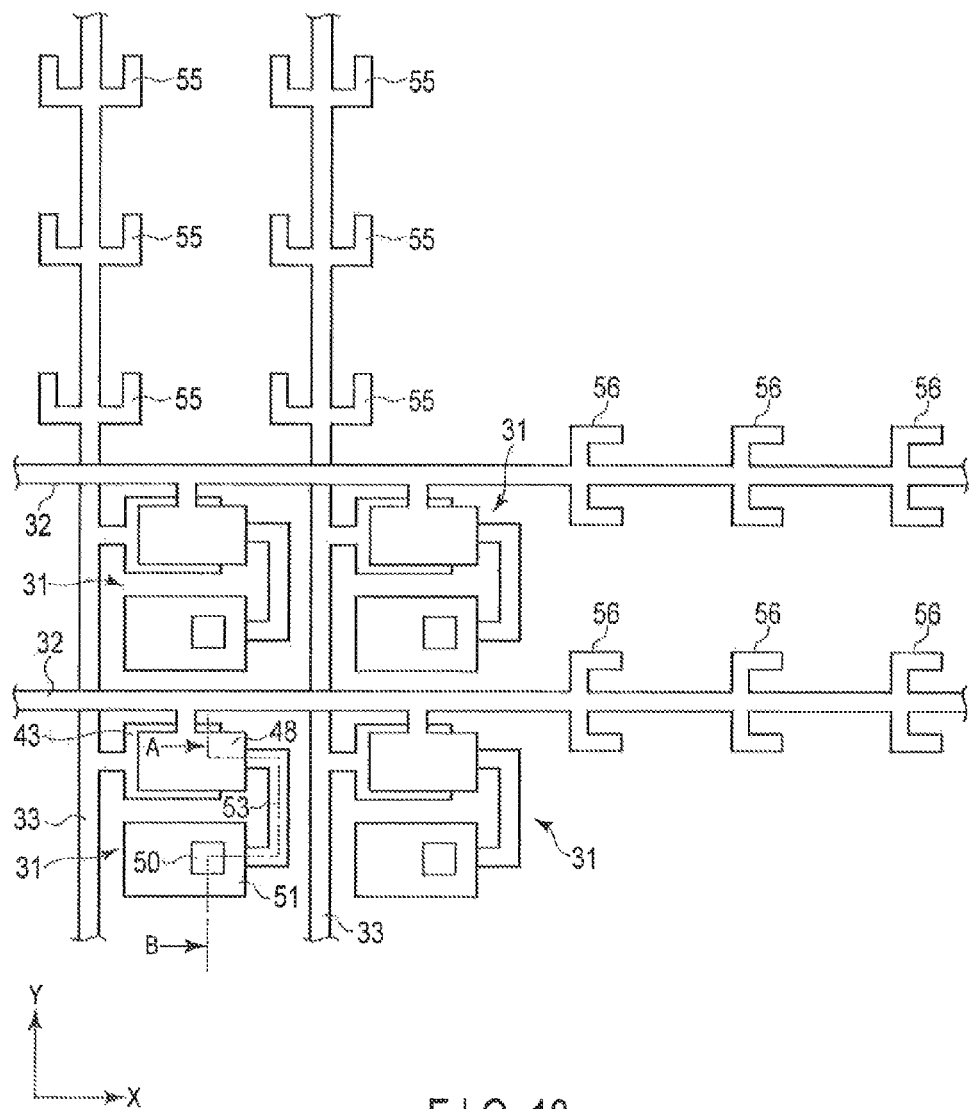
FIG. 13 is a plan view showing an active matrix to which a method of forming a pattern is applied according to a second embodiment.
Figure 14:
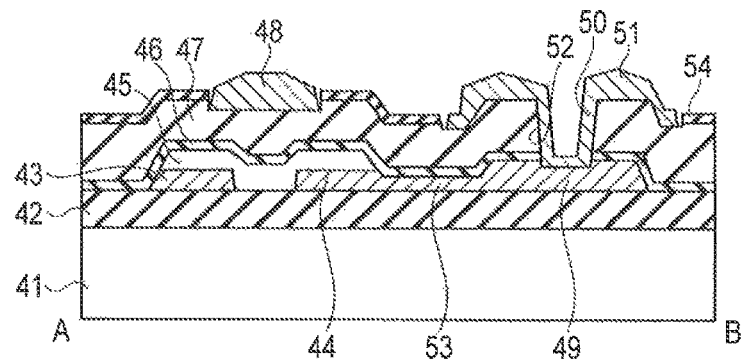
FIG. 14 is a cross-sectional view taken along line A-B of FIG. 13.

A second embodiment will be described hereinafter with reference to FIG. 13 and FIG. 14. FIG. 13 is a plan view showing an active matrix in which plurality of thin-film transistors having a top-gate-bottom-contact structure are arranged in x- and y-directions. FIG. 14 is a cross-sectional view taken along line A-B of the thin-film transistor of FIG. 13.

The active matrix comprises plurality of thin-film transistors 31, a gate signal line 32 and a source signal line 33. The gate signal line 32 is connected to a gate electrode described later. An end of the gate signal line 32 extends in the x-direction (the horizontal direction on the paper plane) and is connected to a connection pad (not shown). The source signal line 33 is connected to a source electrode described later. An end of the source signal line 33 extends in the y-direction (the perpendicular direction on the paper plane) and is connected to the connection pad (not shown).

Each of the thin-film transistors 31 comprises a substrate 41 as shown in FIG. 14. A resin layer 42 is formed on the main surface of the substrate 41. A source electrode 43, a drain electrode 44 and a lower electrode 49 are formed on the resin layer 42. The drain electrode 44 and the lower electrode 49 are electrically connected with each other by an interconnection 53 formed on the resin layer 42. For example, the source electrode 43, the drain electrode 44, the lower electrode 49 and the interconnection 53 are made of, for example, nanoparticles conductive material. The lower electrode 49 preferably has a film thickness greater than that of the source electrode 43 and the drain electrode 44. A semiconductor layer 45 is formed in the channel area between the source electrode 43 and the drain electrode 44 and on the portion of the source and drain electrodes 43 and 44 near the channel area. The semiconductor layer 45 is made of, for example, a macromolecular organic material. A first gate insulating layer 46 covers the whole surface of the resin layer 42 including the semiconductor layer 45. The first gate insulating layer 46 is made of, for example, non-photosensitive resin.

A second gate insulating layer 47 is formed on the first gate insulating layer 46. The second gate insulating layer 47 is made of, for example, a chemical amplification type of photosensitive resin showing lyophilic properties. A gate electrode 48 is formed on the second gate insulating layer 47 corresponding to the channel area. The gate electrode 48 is made of, for example, a nanoparticles conductive material. A fine pore 52 corresponds to a part of the lower electrode 49 and is open over the second gate insulating layer 47, the first gate insulating layer 46 and the surface layer of the lower electrode 49. An upper electrode 51 includes the fine pore 52 and is formed on the second gate insulating layer 47 around the fine pore 52. A through-hole 50 is formed in the portion of the fine pore 52. The upper electrode 51 is electrically connected to the lower electrode 49 via the through-hole 50. The upper electrode 51 is made of, for example, a nanoparticle conductive material.

The source signal line 33 is formed on the resin layer 42 and is electrically connected to the source electrode 43 of each of the thin-film transistors 31. The gate signal line 32 is formed on the second gate insulating layer 47 and is electrically connected to the gate electrode 48 of each of the thin-film transistors 31.

A liquid-repellent layer 54 is formed on the second gate insulating layer 47 excluding the gate electrode 48, the upper electrode 51 and the gate signal line 32.

Now, a method of forming the source electrode 43, the drain electrode 44, the lower electrode 49, the interconnection 53 and the source signal line 33 on the resin layer 42 in the active matrix shown in FIG. 13 and FIG. 14 will be described hereinafter.

The resin layer 42 has liquid-repellent properties in which the surface free energy is small. A lyophilic pattern is formed by selectively irradiating the liquid-repellent layer with ultraviolet light having a short wavelength of 150 to 250 nm as shown in FIGS. 2 (a) and (b) of the first embodiment. The lyophilic pattern is formed in the portions of the liquid-repellent layer corresponding to the source electrode 43, the drain electrode 44, the lower electrode 49, the interconnection 53 and the source signal line 33. Of these lyophilic patterns, the lyophilic pattern corresponding to the source signal line 33 comprises a linear main lyophilic pattern and a plurality of auxiliary lyophilic patterns as follows. The linear main lyophilic pattern is connected to the source electrode. An end of the linear main lyophilic pattern extends in the y-direction (the perpendicular direction on the paper plane) and is connected to the connection pad (not shown). The auxiliary lyophilic patterns are connected to the portion of the main lyophilic pattern extending from the active matrix region in the y-direction (the perpendicular direction on the paper plane) and ranging over the connection pad (not shown) with a desired distance. The auxiliary lyophilic patterns have the same shape as the shape explained in the first embodiment. A plurality of liquid-repellent regions are defined in the liquid-repellent layer between the main lyophilic pattern and the auxiliary lyophilic pattern, respectively. Each of the liquid-repellent regions is closed by the portion connecting the main lyophilic pattern and the auxiliary lyophilic pattern on the upstream side for the application direction (the y-direction indicated by the arrow along the main lyophilic pattern) and is open on the downstream side from the connection portion.

After forming the lyophilic patterns on the liquid-repellent layer, conductive ink, for example, metal nanoparticles dispersion aqueous ink is applied by means of an ink retention member in the y-direction indicated by the arrow along the linear main lyophilic pattern of the lyophilic pattern corresponding to the source signal line. In this manner, on the resin layer, ink is selectively applied to the lyophilic patterns whose contact angle relative to the ink is smaller than that of the liquid-repellent layer, and thus, conductive ink patterns are formed. At this time, of the lyophilic patterns, in the lyophilic pattern corresponding to the source signal line, a plurality of auxiliary lyophilic patterns are connected to the main lyophilic pattern as described above. Therefore, a thick conductive ink pattern is formed on the main lyophilic pattern by an effect similar to that of the first embodiment. Subsequently, these conductive ink patterns are cured. By this curing process, the source electrode 43, the drain electrode 44, the lower electrode 49 and the interconnection 53 can be formed on the resin layer. Further, the source signal line 33 having a thick film can be formed. FIG. 13 shows a U-shaped conductive pattern 55. The U-shaped conductive pattern 55 is formed on each auxiliary lyophilic pattern provided in the portion of the main lyophilic pattern extending from the active matrix region in the y-direction (the perpendicular direction on the paper plane) and ranging over the connection pad (not shown), and is connected to the source signal line 33.

When the source electrode 43, the drain electrode 44, the lower electrode 49 and the interconnection 53 are formed by application of conductive ink and curing, the conductive ink is applied along the extension direction of the source signal line 33. In this manner, the ink is smoothly applied. It is possible to form the source electrode 43, the drain electrode 44, the lower electrode 49 and the interconnection 53 such that defects are difficult to occur, and the film thickness is uniform.

On the other hand, the source signal line 33 having a thick film has low resistance as a whole. Thus, it is possible to obtain an excellent active matrix which controls or prevents propagation delay and voltage depression.

Now, a method of forming the gate electrode 48, the upper electrode 51 and the gate signal line 32 on the second gate insulating layer 47 in the active matrix shown in FIG. 13 and FIG. 14 will be described hereinafter.

The second gate insulating layer 47 has lyophilic properties in which the surface free energy is large. After covering the whole surface of the second gate insulating layer 47 with liquid-repellent layer 54, for example, laser ablation is applied to selectively remove the liquid-repellent layer 54 and expose the surface of the second gate insulating layer 47 having lyophilic properties. In this manner, plural concave lyophilic patterns are formed. The lyophilic patterns are formed in the removal portions of the liquid-repellent layer corresponding to the gate electrode 48, the upper electrode 51 and the gate signal line 32. Of these lyophilic patterns, the lyophilic pattern corresponding to the gate signal line 32 comprises a linear main lyophilic pattern and a plurality of auxiliary lyophilic patterns as follows. The linear main lyophilic pattern is connected to the gate electrode. An end of the linear main lyophilic pattern extends in the x-direction (the horizontal direction on the paper plane) and is connected to the connection pad (not shown). The auxiliary lyophilic patterns are connected to the portion of the main lyophilic pattern extending from the active matrix region in the x-direction (the horizontal direction on the paper plane) and ranging over the connection pad (not shown) with a desired distance. The auxiliary lyophilic patterns have the same shape as the shape explained in the first embodiment. A plural of liquid-repellent regions are defined in the liquid-repellent layer between the main lyophilic pattern and the first auxiliary lyophilic pattern, respectively. Each of liquid-repellent regions is closed by the portion connecting the main lyophilic pattern and the auxiliary lyophilic pattern on the upstream side for the application direction indicated by the x-direction, and is open on the downstream side from the connection portion.

Thus, the lyophilic pattern is exposed and formed by selectively removing liquid-repellent layer 54. Subsequently, conductive ink, for example, metal nanoparticles dispersion aqueous ink is applied by means of the ink retention member in the x-direction indicated by the arrow along the linear main lyophilic pattern of the lyophilic pattern corresponding to the gate signal line. In this manner, on the second gate insulating layer 47, ink is selectively applied to the lyophilic patterns whose contact angle relative to the ink is smaller than that of liquid-repellent layer 54. Thus, conductive ink patterns are formed. At this time, in the lyophilic pattern corresponding to the gate signal line, plural auxiliary lyophilic patterns are connected to the main lyophilic pattern. Thus, a thick conductive ink pattern is formed on the main lyophilic pattern by the effect explained in the first embodiment. Subsequently, these conductive ink patterns are cured. In this manner, the gate electrode 48 and the upper electrode 51 can be formed on the second gate insulating layer 47. Further, the gate signal line 32 having a thick film can be formed. FIG. 13 shows a U-shaped conductive pattern 56. The U-shaped conductive pattern 56 is formed on each auxiliary lyophilic pattern provided in the portion of the main lyophilic pattern extending from the active matrix region in the x-direction (the horizontal direction on the paper plane) and ranging over the connection pad (not shown), and is connected to the gate signal line 32.

When the gate electrode 48 and the upper electrode 51 are formed by application of conductive ink and curing, the conductive ink is applied along the extension direction of the gate signal line 32. In this manner, the ink is smoothly applied. Thus, it is possible to form the gate electrode 48 and the upper electrode 51 such that detects are difficult to occur, and the film thickness is uniform.

On the other hand, the gate signal line 32 having a thick film has low resistance as a whole. Thus, it is possible to obtain an excellent active matrix which controls or prevents propagation delay and voltage depression.

Figure 15:
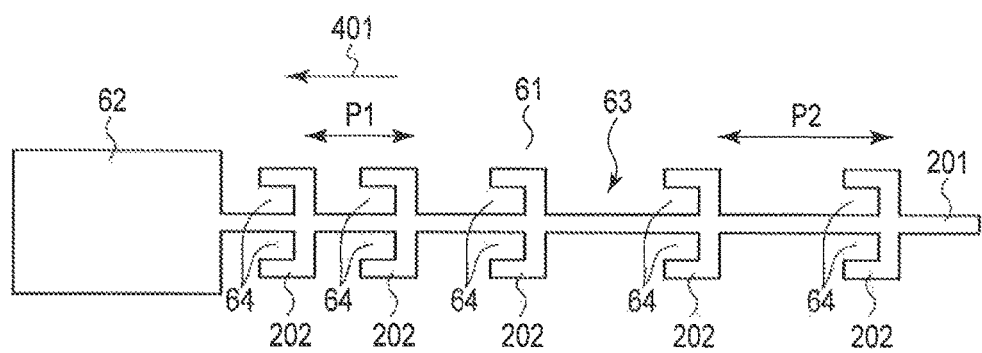
FIG. 15 is shown for explaining another method of forming a pattern according to the second embodiment.
Figure 16:
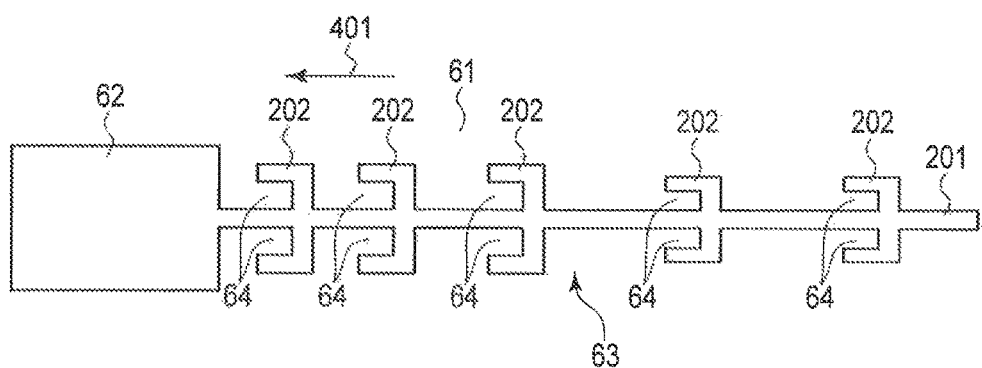
FIG. 16 is shown for explaining another method of forming a pattern according to the second embodiment.

Now, this specification explains another form of the source signal line which is a lead wire with reference to FIG. 15 and FIG. 16.

In the form in which the source signal line extending from the active matrix region is connected to the connection pad, the width of the connection pad is greater than that of the source signal line. When lyophilic patterns corresponding to the connection pad and the source signal line are formed on the liquid-repellent layer, and conductive ink is applied, the amount of conductive ink is large in the lyophilic pattern corresponding to the connection pad. As a result, conductive ink is drawn to the lyophilic pattern corresponding to the connection pad from the portion of the lyophilic pattern corresponding to the source signal line connected to the lyophilic pattern corresponding to the connection pad. The amount of conductive ink applied to the lyophilic pattern corresponding to the source signal line is effectively small, and thus, the film thickness is reduced. If a connection pad and a source signal line are formed by forming conductive ink patterns on the lyophilic patterns corresponding to the connection pad and the source signal line and curing the patterns, disconnection may occur in the connection portion between the connection pad and the source signal line.

In consideration of the above problem, a pad lyophilic pattern 62 corresponding to the connection pad, and a signal line lyophilic pattern 63 are formed on a liquid-repellent layer 61 as shown in FIG. 15. The signal line lyophilic pattern 63 comprises a linear main lyophilic pattern 201 extending from the active matrix region and connected to the pad lyophilic pattern 62, and a plurality of auxiliary lyophilic patterns 202 connected to the main lyophilic pattern 201 along the main lyophilic pattern 201. A plurality of liquid-repellent regions 64 are defined in the liquid-repellent layer 61 between the main lyophilic pattern 201 and the auxiliary lyophilic pattern 202, respectively. In other words, two the liquid-repellent regions 64 are defined in two surface portions of the liquid-repellent layer 2 partitioned with the main lyophilic pattern 201 and one auxiliary lyophilic pattern 202a, respectively. Each of liquid-repellent regions 64 is closed by the portion connecting the main lyophilic pattern 201 and the auxiliary lyophilic pattern 202 on the upstream side in the application direction parallel with the main lyophilic pattern indicated by an arrow 401 and is open on the downstream side from the connection portion. In the auxiliary lyophilic patterns 202, pitch P1 between the auxiliary lyophilic patterns 202 on the side connected to the pad lyophilic pattern 62 is narrower than pitch P2 between the auxiliary lyophilic patterns 202 on the active matrix side.

In the example of the lyophilic pattern shown in FIG. 15, when conductive ink, for example, metal nanoparticles dispersion aqueous ink is applied by means of the ink retention member in the direction indicated by the arrow 401 parallel with the linear main lyophilic pattern of the signal line lyophilic pattern 63, ink is selectively applied to lyophilic patterns 62 and 63. In this manner, conductive ink patterns are formed. At this time, in the signal line lyophilic pattern 63, the auxiliary lyophilic patterns 202 are connected to the main lyophilic pattern 201. Further, pitch P1 between the auxiliary lyophilic patterns 202 on the side connected to the pad lyophilic pattern 62 is narrower than pitch P2 between the auxiliary lyophilic patterns 202 on the active matrix side. As a result, the amount of ink which is moved to the linear main lyophilic pattern 201 from the ink accumulation regions formed in liquid-repellent regions 64 of the portion of lyophilic pattern 63 on the side connected to the pad lyophilic pattern 62 in association with the move of conductive ink can be increased compared to that of the portion of lyophilic pattern 63 on the active matrix side. Thus, it is possible to effectively increase the amount of conductive ink applied to the main lyophilic pattern 201 of lyophilic pattern 63 located near the pad lyophilic pattern 62. In this manner, the film thickness can be increased. As a result, it is possible to control or prevent disconnection in the connection portion between the connection pad and the source signal line obtained by curing of the conductive ink pattern.

Pitch P1 between the auxiliary lyophilic patterns 202 on the side connected to the pad lyophilic pattern 62 relies on the area of the pad, etc. However, pitch P1 is preferably three to ten times the width of the main lyophilic pattern 201 of the signal line lyophilic pattern 63.

As shown in FIG. 16, the sizes of the auxiliary lyophilic patterns may differ from each other to prevent disconnection in the connection portion between the connection pad and the source signal line.

The signal line lyophilic pattern 63 comprises the linear main lyophilic pattern 201 and the auxiliary lyophilic patterns 202. The linear main lyophilic pattern 201 extends from the active matrix and connecting to the pad lyophilic pattern 62. Each of the auxiliary lyophilic patterns 202 is connected to the main lyophilic pattern 201 along the main lyophilic. In the signal line lyophilic pattern 63, the dimensions of the auxiliary lyophilic patterns 202 on the side connected to the pad lyophilic pattern 62 are greater than those of the auxiliary lyophilic patterns 202 on the active matrix side. The areas of liquid-repellent regions 64 defined in the liquid-repellent layer 61 between the main lyophilic pattern 201 and the auxiliary lyophilic patterns 202 provided on the side connected to the pad lyophilic pattern 62 are substantially greater than the areas of liquid-repellent regions 64 defined in the liquid-repellent layer 61 between the main lyophilic pattern 201 and the auxiliary lyophilic patterns 202 provided on the active matrix side.

Therefore, the move amount of ink to the linear main lyophilic pattern 201 from the ink accumulation regions formed in a plurality of liquid-repellent regions 64 in the portion of lyophilic pattern 63 on the side connected to the pad lyophilic pattern 62 in association with move of ink can be increased compared to that of the portion of lyophilic pattern 63 on the active matrix side. In this manner, it is possible to effectively increase the amount of conductive ink applied to the main lyophilic pattern 201 of lyophilic pattern 63 provided near the pad lyophilic pattern 62, and thus, the film thickness can be increased. As a result, it is possible to control or prevent disconnection in the connection portion between the connection pad and the source signal line obtained by curing of the conductive ink patterns.

(Third Embodiment)

A third embodiment will be described hereinafter with reference to FIG. 17 and FIG. 18.

In the third embodiment, two lyophilic patterns, which have a plurality of auxiliary lyophilic patterns, respectively, are formed in proximity to each other on a liquid-repellent layer such that the auxiliary lyophilic patterns are alternately positioned.

Figure 17:
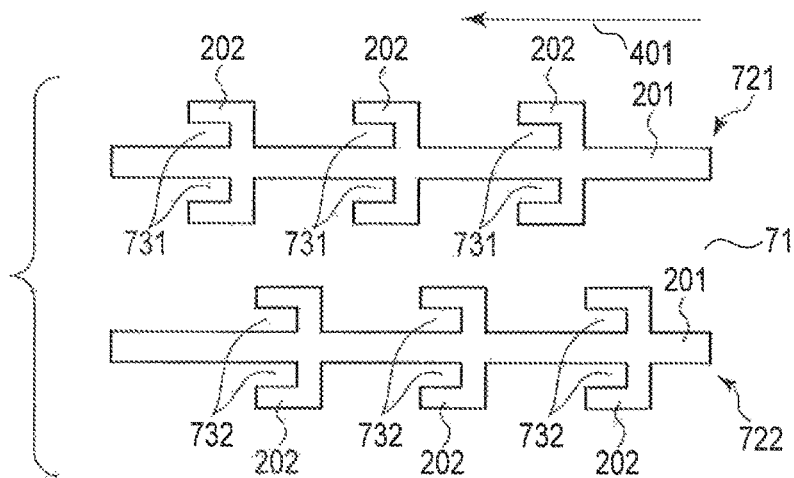
FIG. 17 is shown for explaining a method of forming a pattern according to a third embodiment.

(1) As shown in FIG. 17, a first lyophilic pattern 721 and a second lyophilic pattern 722 are formed in proximity to each other on a liquid-repellent layer 71. Each of the first and second lyophilic patterns 721 and 722 comprises a linear main lyophilic pattern 201 and a plurality of, for example, three auxiliary lyophilic patterns 202 connected to the main lyophilic pattern 201 along the main lyophilic pattern 201. A plurality of, for example, six liquid-repellent regions 731 in the first lyophilic pattern 721 are defined in the liquid-repellent layer 71 between the main lyophilic pattern 201 and the auxiliary lyophilic patterns 202, respectively. A plurality of, for example, six liquid-repellent regions 732 in the second lyophilic pattern 722 are defined in the liquid-repellent layer 71 between the main lyophilic pattern 201 and the auxiliary lyophilic patterns 202, respectively. In other words, the liquid-repellent region 731 or the liquid-repellent region 732 is defined in surface portion of the liquid-repellent layer 71 partitioned with the main lyophilic pattern 201 and one auxiliary lyophilic pattern 202, respectively. Each of liquid-repellent regions 731 and 732 is closed by the portion connecting the main lyophilic pattern 201 and the auxiliary lyophilic pattern 202 on the upstream side in the application direction parallel with the main lyophilic pattern indicated by an arrow 401, and is open on the downstream side from the connection portion. The auxiliary lyophilic patterns 202 of the first lyophilic pattern 721 are alternately arranged with respect to the auxiliary lyophilic patterns 202 of the second lyophilic pattern 722 such that an auxiliary lyophilic pattern 202 of the first lyophilic pattern 721 is allocated between two auxiliary lyophilic patterns 202 of the second lyophilic pattern 722.

Even if the first and the second lyophilic patterns 721 and 722 are arranged in proximity to each other, the structure shown in FIG. 17 enables the areas of the first and second liquid-repellent regions 731 and 732 to be maintained at predetermined areas by alternately arranging the auxiliary lyophilic patterns 202 of the second lyophilic pattern 722 with respect to the auxiliary lyophilic patterns 202 of the first lyophilic pattern 721 such that an auxiliary lyophilic pattern 202 of the second lyophilic pattern 722 is allocated between two auxiliary lyophilic patterns 202 of the first lyophilic pattern 721. Moreover, it is possible to form conductive patterns without short circuiting each other by formation and curing of conductive ink patterns on the first and second lyophilic patterns 721 and 722.

In FIG. 17, the auxiliary lyophilic patterns 202 of the first lyophilic pattern 721 are alternately arranged one by one with respect to the auxiliary lyophilic patterns 202 of the second lyophilic pattern 722. In anther embodiment having lyophilic patterns arranged in proximity to each other, the position of each auxiliary lyophilic pattern may be shifted by ⅓ in the pitch such that three lyophilic patterns constitute one pair.

Figure 18A:
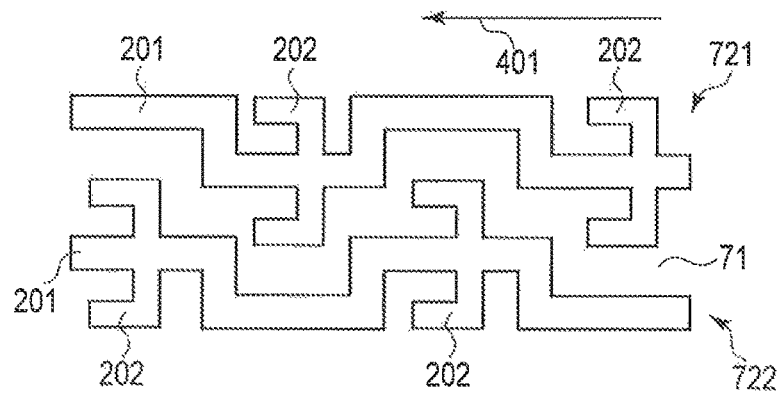
FIGS. 18A and 18B are shown for explaining another method of forming a pattern according to the third embodiment.
Figure 18B:
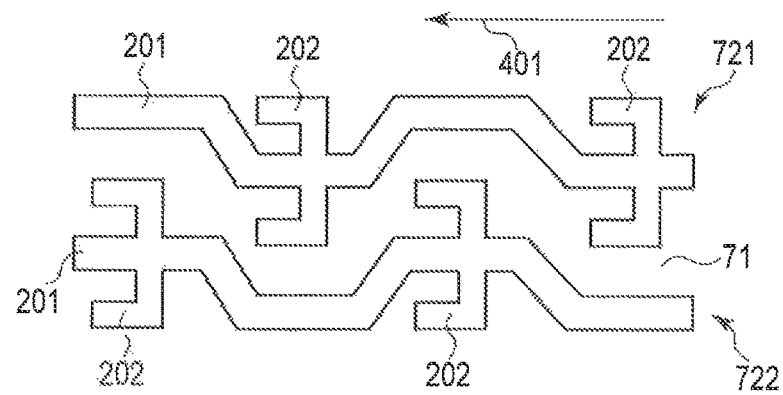

(2) As shown in FIG. 18, the first lyophilic pattern 721 and the second lyophilic pattern 722 are formed in proximity to each other on liquid-repellent layer 71. The main lyophilic patterns 201 of the first and second lyophilic patterns 723 and 722 are bent in the same shape. In the first lyophilic pattern 721, the auxiliary lyophilic pattern 202 is connected to every other bent portion of the main lyophilic pattern 201. In the second lyophilic pattern 722, the auxiliary lyophilic pattern 202 is connected to every other bent portion of the main lyophilic pattern 201 so as to be out of alignment with the auxiliary lyophilic patterns 202 connected to the main lyophilic pattern 201 of the first lyophilic pattern 721. The bent angle may be 90 degrees as shown in FIG. 18(A) or may be oblique as shown in FIG. 18(B). The arrows 401 of FIG. 18 indicate the application direction of ink.

By the structure shown in FIG. 18, the interval of adjacent first and second lyophilic patterns 721 and 722 can be further shortened.

The adjacent lyophilic patterns are nearly parallel with each other; however, they may be bent in the portions in which the auxiliary lyophilic patterns are provided.

(Fourth Embodiment)

A fourth embodiment will be described hereinafter with reference to FIG. 19.

In the first to third embodiments, each of the auxiliary lyophilic patterns constituting a lyophilic pattern has a U-shape bent at 90 degrees in two positions in the longitudinal direction of the main lyophilic pattern, and is connected to the main lyophilic pattern in the middle position between the bent portions.

In addition to the above auxiliary lyophilic patterns, the shapes shown in FIG. 19(A) to FIG. 19(E) below can form a thick ink pattern (for example, a thick conductive ink pattern) on the main lyophilic pattern. A substrate has a liquid-repellent layer 80 and a lyophilic pattern 81 which are located a surface of the substrate. The lyophilic pattern 81 comprises a linear main lyophilic pattern 201 and four auxiliary lyophilic patterns 202. The auxiliary lyophilic patterns 202 are connected to the main lyophilic pattern 201 with a desired distance along the main lyophilic pattern 201. Excluding as shown in FIG. 19(D), eight liquid-repellent regions 82 defined in the liquid-repellent layer 80 between the main lyophilic pattern 201 and the four auxiliary lyophilic patterns 202 are closed by the portions connecting the main lyophilic pattern 201 and the auxiliary lyophilic patterns 202 on the upstream side in the application direction indicated by the arrow 401, and are open on the downstream side from the connection portion. Two liquid-repellent regions which are defined in the liquid-repellent layer 80 between the main lyophilic pattern 201 and one auxiliary lyophilic pattern 202, are symmetrically formed on both sides of the main lyophilic pattern 201.

(1) A lyophilic pattern 81 shown in FIG. 19(A) comprises a linear main lyophilic pattern 201 and four auxiliary lyophilic patterns 202. Each of the auxiliary lyophilic patterns 202 is connected to the main lyophilic pattern 201 with a desired distance from the main lyophilic pattern 201 and having V-shape. Eight liquid-repellent regions 82, which are defined in the liquid-repellent layer 80 between the main lyophilic pattern 201 and the four auxiliary lyophilic patterns 202, have a triangular shape.

(2) Lyophilic pattern 81 shown in FIG. 19(B) comprises a linear main lyophilic pattern 201 and four auxiliary lyophilic patterns 202. Each of the auxiliary lyophilic patterns 202 is connected to the main lyophilic pattern 201 with a desired distance from the main lyophilic pattern 201 and having V-shape. The vicinities of both end portions of each auxiliary lyophilic pattern 202 are bent parallel to the main lyophilic pattern 201. Eight liquid-repellent regions 82, which are defined in the liquid-repellent layer 80 between the main lyophilic pattern 201 and the auxiliary lyophilic patterns 202, are trapezoidal.

(3) Lyophilic pattern 81 shown in FIG. 19(C) comprises a linear main lyophilic pattern 201 and four auxiliary lyophilic patterns 202. Each of the auxiliary lyophilic patterns 202 is connected to the main lyophilic pattern 201 with a desired distance from the main lyophilic pattern 201 and incline in the direction opposite to the application direction. The vicinities of both end portions of each of the auxiliary lyophilic patterns 202 are bent parallel to the main lyophilic pattern 201. Eight liquid-repellent regions 82, which are defined in the liquid-repellent layer 80 between the main lyophilic pattern 201 and the auxiliary lyophilic patterns 202, have an inverted-trapezoidal shape relative to the shape of FIG. 19(B).

(4) A lyophilic pattern 81 shown in FIG. 19(D) comprises the linear main lyophilic pattern 201 and four H-shaped auxiliary lyophilic patterns 202. Each of auxiliary lyophilic patterns 202 is connected to the main lyophilic pattern 201 with a desired distance from the main lyophilic pattern 201. Sixteen liquid-repellent regions 82, which are defined in the liquid-repellent layer 80 between the main lyophilic pattern 201 and the auxiliary lyophilic patterns 202, are rectangular.

A formation of the sixteen liquid-repellent regions 82 will be described in detail below.

Four liquid-repellent regions 82 are defined in the liquid-repellent layer 80 between the main lyophilic pattern 201 and one H-shaped auxiliary lyophilic patterns 202. Two liquid-repellent regions 82 and two residual liquid-repellent regions 82 the four liquid-repellent regions 82 are symmetrically arranged for vertical direction to the application direction indicated by the arrow 401. Each of the two liquid-repellent regions 82 and the two residual liquid-repellent regions 82 are symmetrically arranged on both sides of the main lyophilic pattern 201. Each of the two liquid-repellent regions 82 is closed by the portions connecting the main lyophilic pattern 201 and the auxiliary lyophilic patterns 202 on the upstream side for the application direction and is open from the connection portion to the downstream side and the downstream side. Each of the two residual liquid-repellent regions 82 is closed by the portions connecting the main lyophilic pattern 201 and the auxiliary lyophilic patterns 202 on the downstream side for the application direction and is open from the connection portion to the upstream side and the downstream side.

(5) A lyophilic pattern 81 shown in FIG. 19(E) comprises the linear main lyophilic pattern 201 and for example, four C-shaped auxiliary lyophilic patterns 202 which are connected to the main lyophilic pattern 201 with a desired distance along the main lyophilic pattern 201. The vicinities of both end portions of each auxiliary lyophilic pattern 202 are bent parallel to the main lyophilic pattern 201. Eight liquid-repellent regions 82 defined in the liquid-repellent layer 80 between the main lyophilic pattern 201 and the auxiliary lyophilic patterns 202 have a trapezoidal shape having a curved surface portion.

Each of auxiliary lyophilic patterns 202 is connected to the linear main lyophilic patterns 201 at the middle portion of as shown in FIG. 19(A), FIG. 19(B), FIG. 19(C) and FIG. 19(E), the both sides of the auxiliary lyophilic pattern 202 incline relative to the application direction indicated by the arrow 401. Thus, the ink flow is smooth at the time of application. The incidence rate of defects of patterns can be improved.

By connecting the auxiliary lyophilic patterns 202 having an H-shape to the main lyophilic pattern 201 as shown in FIG. 19(D), sixteen liquid-repellent regions 82 are defined in the liquid-repellent layer 80 between the main lyophilic pattern 201 and the four H-shaped auxiliary lyophilic patterns 202. Eight liquid-repellent regions 82 in the sixteen liquid-repellent regions 82 are open from portions connecting the main lyophilic pattern 201 and the auxiliary lyophilic patterns 202 to the upstream side for the application direction. Eight residual liquid-repellent regions 82 in the sixteen liquid-repellent regions 82 are open from portions connecting the main lyophilic pattern 201 and the auxiliary lyophilic patterns 202 to the upstream side for the application direction. That is, eight liquid-repellent regions 82 and eight residual liquid-repellent regions 82 in the sixteen liquid-repellent regions 82 are open on the upstream side and downstream side for the application direction, respectively. Thus, it is possible to form a thick ink pattern (for example, a thick conductive ink pattern) on the linear main lyophilic pattern 201 even if the application direction is reversed. The application direction may be selected in accordance with the process conditions.

In the first to third embodiments and FIG. 19(A) to FIG. 19(E), each auxiliary lyophilic pattern 202 is provided so as to be line-symmetric about the linear main lyophilic pattern 201; however, each auxiliary lyophilic pattern may be connected to only one side of the linear main lyophilic pattern. The auxiliary lyophilic patterns may be alternately connected to one side of the linear main lyophilic pattern along the linear main lyophilic pattern. This structure brings about an effect which can form a thick ink pattern from the surrounding pattern design even if the auxiliary lyophilic patterns are connected to one side of the linear main lyophilic pattern.

(Fifth Embodiment)

A fifth embodiment will be described hereinafter with reference to FIG. 20.

In the first to fourth embodiments, a lyophilic pattern is allocated such that its linear main lyophilic pattern is parallel with the application direction. In the fifth embodiment, a lyophilic pattern is allocated such that its linear main lyophilic pattern inclines at desired degrees relative to the application direction.

As shown in FIG. 20(A), a substrate (not shown) has the liquid-repellent layer 90 and, for example, adjacent lyophilic patterns 91 which are located a surface of the substrate. The adjacent lyophilic patterns 91 are allocated such that their linear main lyophilic patterns 201 incline at desired degrees relative to the application direction indicated by an arrow 401. The angle between the application direction and each of the main lyophilic patterns 201 may be set to, for example, 5 to 20 degrees.

Each of lyophilic patterns 91 comprises a linear main lyophilic pattern 201 and four V-shaped auxiliary lyophilic patterns 202. The auxiliary lyophilic patterns 202 are connected to the main lyophilic pattern 201 with a desired distance along the main lyophilic pattern 201. Eight liquid-repellent regions 92a and 92b are defined in the liquid-repellent layer 90 between the linear main lyophilic pattern 201 and the four auxiliary lyophilic patterns 202, respectively. In Eight liquid-repellent regions 92a and 92b, two liquid-repellent regions 92a and 92b, which are defined in the liquid-repellent layer 90 between the linear main lyophilic pattern 201 and one auxiliary lyophilic pattern 202, are closed by the portion connecting the main lyophilic pattern 201 and the auxiliary lyophilic pattern 202 on the upstream side for the application direction indicated by the arrow 401, and are open on the downstream side from the connection portion. As shown in FIG. 20(A), the effective areas of liquid-repellent regions 92a and 92b are the areas defined by the linear main lyophilic pattern 201, the auxiliary lyophilic pattern 202 and a line perpendicular to the application direction. Thus, the area of liquid-repellent region 92a provided on the left side relative to the application direction is large, and the area of liquid-repellent region 92b provided on the right side is small. Even if each auxiliary lyophilic pattern has a U-shape as shown in the first embodiment, the effective areas of the left and right liquid-repellent regions have a tendency similar to those of the V-shape on the basis of the border of the linear main lyophilic pattern 201.

When lyophilic patterns 91 shown in FIG. 20(A) are applied to formation of lead wires, the angle of the linear main lyophilic patterns 201 may be changed relative to the application direction to change the pitch of the lead wires.

Even in this case, it is possible to form thick ink patterns (for example, thick conductive ink patterns) on the linear main lyophilic patterns 201.

When the linear main lyophilic pattern 201 of each lyophilic pattern 91 inclines to right in the application direction as shown in FIG. 20(B), the linear auxiliary lyophilic patterns 203 are obliquely connected to only the left portion of the main lyophilic pattern 201 with reference to the application direction. When the auxiliary lyophilic patterns 203 are obliquely connected in this manner, it is possible to define liquid-repellent regions 92 having sufficient areas in the liquid-repellent layer 90 which is partitioned with the linear main lyophilic patterns 201, the auxiliary lyophilic patterns 203 and lines perpendicular to the application direction. The positions which connect the linear auxiliary lyophilic patterns 203 to each main lyophilic pattern 201 may be determined based on the relationship between the application direction and an inclination of the linear main lyophilic pattern 201.

When the apical end of each lyophilic pattern 91 is bent to left in FIG. 20(B), a linear auxiliary lyophilic pattern may be additionally connected to the right side of the apical end of each linear main lyophilic pattern 201 in the application direction, or a linear auxiliary lyophilic pattern may be connected to the right side instead of each auxiliary lyophilic pattern 203 provided on the left side.

(Sixth Embodiment)

A sixth embodiment will be described hereinafter with reference to FIG. 21.

Figure 21:
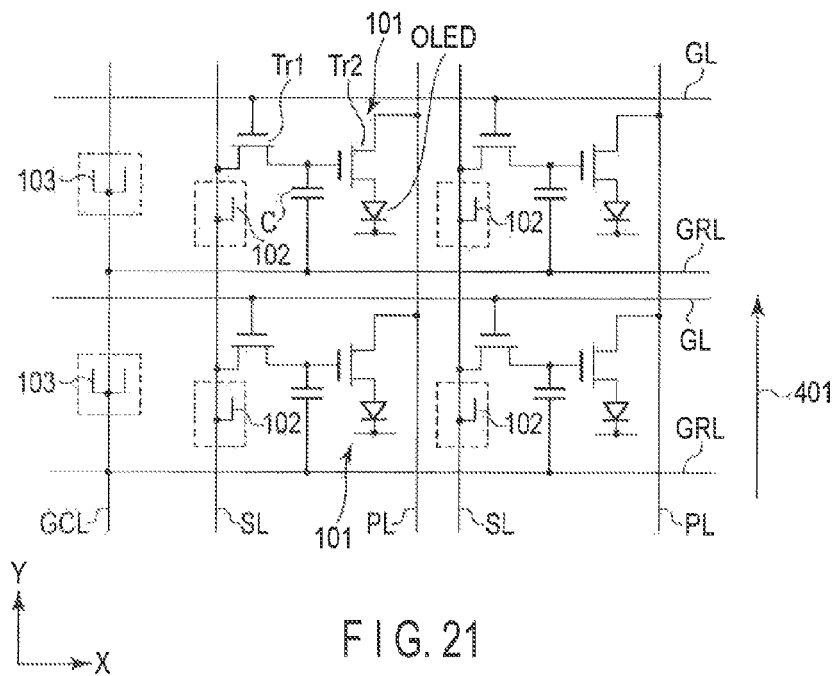
FIG. 21 shows an active matrix to which a method of forming a pattern is applied according to a sixth embodiment.

FIG. 21 shows the equivalent circuit of an active matrix comprising a plurality of pixel portions which comprise organic light emitting diodes (OLED) and are arranged in z- and y-directions.

A pixel portion 101 comprises a selective transistor Tr1 and a driving transistor Tr2.

The source of the selective transistor Tr1 is connected to a signal line SL extending in the y-direction (the longitudinal direction on the paper plane). The gate of the selective transistor Tr1 is connected to a gate line GL extending in the x-direction (the lateral direction on the paper plane). The drain of the selective transistor Tr1 is connected to the gate of the second drive transistor Tr2. The line connecting the drain of the selective transistor Tr1 and the gate of the driving transistor Tr2 diverges and is connected to a ground line GRL extending in the x-direction. In this divergence line, a capacitor C is interposed. A plurality of ground lines GRL are connected to a ground connection line GCL extending in the y-direction. The source of the driving transistor Tr2 is connected to a power line PL extending in the y-direction. The drain of the driving transistor Tr2 is connected to an organic light emitting diode OLED.

In the active matrix shown in FIG. 21, for example, when predetermined voltage is applied to each of the signal line SL connected to the source of the selective transistor Tr1 of the upper left pixel portion 101 and the gate line GL connected to the gate of the selective transistor Tr1 of the same pixel portion 101, the selective transistor Tr1 is turned on. After the selective transistor Tr1 is turned on, predetermined voltage is supplied from the drain of the selective transistor Tr1 to the gate of the second drive transistor Tr2, and thus, the driving transistor Tr2 is turned on. After the driving transistor Tr2 is turned on, current is supplied from the source connected to the power line PL to the drain, and thus, the organic light emitting diode OLED connected to the drain emits light. In short, the organic light emitting diode OLE of the specific pixel portion 101 of the plurality of pixel portions 101 arranged in the z- and y-directions can emit light by selecting a signal line SL and a gate line GL.

In the active matrix shown in FIG. 21, the signal line SL extending in the y-direction on an interlayer insulating film can have a thick film and a reduced resistance even with a narrow width less than, for example, 20 μm, by forming a lyophilic pattern in accordance with the first embodiment (here, the lyophilic pattern comprises a plurality of key-shaped auxiliary lyophilic patterns connected to the right side of the linear main lyophilic pattern). A key-shaped pattern 102 is connected to the formed signal line SL.

The ground connection line GCL extending in the y-direction on another interlayer insulating film can have a thick film and a reduced resistance even with a narrow width less than, for example, 20 μm, by forming a lyophilic pattern in accordance with the first embodiment (here, the lyophilic pattern comprises a plurality of U-shaped auxiliary lyophilic patterns connected to the linear main lyophilic pattern). A U-shaped pattern 103 is connected to the formed ground connection line GCL.

Even if an opposite electrode covers a signal line, etc., in, for example, an active matrix liquid crystal panel, it is possible to prevent increase in parasitic capacity by setting the line width of each auxiliary lyophilic pattern so as to be substantially equal to that of the linear main lyophilic pattern. The increase in parasitic capacity can be also prevented when a ground plane is provided.

(Seventh Embodiment)

A seventh embodiment will be described hereinafter with reference to FIG. 22.

In the seventh embodiment, a substrate (not shown) has a liquid-repellent layer 110 and a lyophilic pattern 111 which are located a surface of the substrate as shown in FIG. 22(A) to FIG. 22(D). In liquid-repellent regions 112 which are closed by the portion connecting the main lyophilic pattern and the auxiliary lyophilic pattern on the upstream side in the application direction 401 and are open on the downstream side from the connection portion, respectively, the dimension of an opening portion in each of the liquid-repellent region 112 is made small by employing the following auxiliary lyophilic patterns.

Figure 22A:
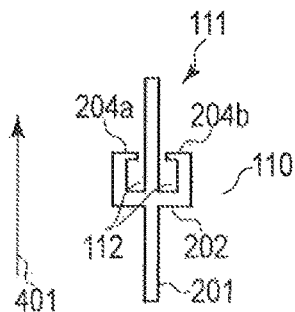
FIGS. 22A, 22B, 22C and 22D are shown for explaining a method of forming a pattern according to a seventh embodiment.

(1) As shown in FIG. 22(A), the lyophilic pattern 111 comprises a linear main lyophilic pattern 201 and an auxiliary lyophilic pattern 202 connected to the main lyophilic pattern 201. Two appentices 204a and 204b perpendicular to the linear main lyophilic pattern 201 are formed at both ends of the U-shape of the auxiliary lyophilic pattern 202 in order to reduce the dimension of the opening portion of the auxiliary lyophilic pattern 202 on the downstream side in the application direction indicated by an arrow 401. Thus, two liquid-repellent regions 112 are defined in the liquid-repellent layer 110 which are partitioned with the main lyophilic pattern 201, the auxiliary lyophilic pattern 202 and the appentices 204a and 204b. The opening on the downstream side for the application direction is narrowed by the appentices 204a and 204b.

In the structure shown in FIG. 22(A), as explained in the first embodiment, when ink is applied by means of an ink retention member in the direction indicated by the arrow 401, the meniscus surface of ink is moved and passes through the auxiliary lyophilic pattern 202. At this time, the appentices 204a and 204b restrict the amount of move of the ink remaining (accumulated) in the liquid-repellent regions 112 to the ink side located between the surface including lyophilic pattern 111 and the ink retention member. By this effect, it is possible to form a thick ink pattern on the main lyophilic pattern 201.

Figure 22B:
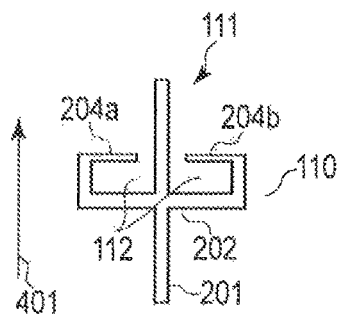

In particular, the effect of the appentices 204a and 204b is significantly enhanced when the auxiliary lyophilic pattern 202 expanded in a direction perpendicular to the application direction is used as shown in FIG. 22(B); in other words, when two liquid-repellent regions 112 are expanded in a direction perpendicular to the application direction and are made larger than liquid-repellent regions 112 shown in FIG. 22(A).

Figure 22C:
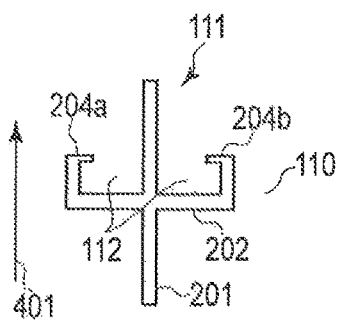

(2) As shown in FIG. 22(C), two appentices 204a and 204b are formed at both ends of the U-shape of the auxiliary lyophilic pattern 202 such that the appentices 204a and 204b are short, small and perpendicular to the linear main lyophilic pattern 201. The dimension of the opening portion of the auxiliary lyophilic pattern 202 on the downstream side for the application direction indicated by the arrow 401 is made slightly small. The liquid-repellent regions 112 are defined in the liquid-repellent layer 110 which are partitioned with the main lyophilic pattern 201, the auxiliary lyophilic pattern 202 and the appentice 204a and 204b, and thus, the opening on the downstream side in the application direction is slightly narrowed by the appentices 204a and 204b.

In the structure shown in FIG. 22(C), as explained in the first embodiment, when ink is applied by means of the ink retention member in the direction indicated by the arrow 401, the meniscus surface of ink is moved and passes through the auxiliary lyophilic pattern 202. At this time, the appentices 204a and 204b restrict the amount of move of the ink remaining (accumulated) in two liquid-repellent regions 112 to the ink side located between the surface including lyophilic pattern 111 and the ink retention member. By this effect, it is possible to form a thick ink pattern on the main lyophilic pattern 201. This effect is less than that of the structure shown in FIG. 22 (B).

However, in the structure shown in FIG. 22(B), the dimension of the opening portion of the auxiliary lyophilic pattern 202 on the downstream side in the application direction is small. Because of this, when ink is applied in the direction indicated by the arrow 401, an ink bridge may be generated between the linear main lyophilic pattern 201 crossing the opening portion and the end portions of the appentices 204a and 204b on the main lyophilic pattern 201 side. Thus, the ink remaining (accumulated) in liquid-repellent regions 112 is difficult to be stably reallocated. The formation of an ink pattern having a sufficiently thick film on the main lyophilic pattern 201 may be disturbed.

On the other hand, in the auxiliary lyophilic pattern 202 shown in FIG. 22(C), the dimension of the opening portion of the auxiliary lyophilic pattern 202 on the downstream side in the application direction indicated by the arrow 401 is made slightly small by the appentices 204a and 204b. Thus, it is possible to prevent generation of an ink bridge between the linear main lyophilic pattern 201 crossing the opening portion and the end portions of the appentices 204a and 204b on the main lyophilic pattern 201 side.

Figure 22D:
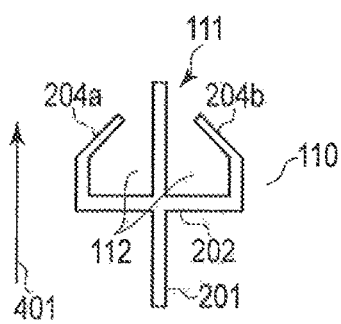

(3) As shown in FIG. 22(D), lyophilic pattern 111 comprises the linear main lyophilic pattern 201 and the U-shaped auxiliary lyophilic pattern 202. The auxiliary lyophilic pattern 202 is connected to the main lyophilic pattern 201. In the auxiliary lyophilic pattern 202, two appentices 204a and 204b are formed at both ends of the U-shape so as to incline toward the linear main lyophilic pattern 201. The dimension of the opening portion of the auxiliary lyophilic pattern 202 on the downstream side in the application direction indicated by the arrow 401 is made small. Thus, two liquid-repellent regions 112 are defined in the liquid-repellent layer 110 which are partitioned with the main lyophilic pattern 201, the auxiliary lyophilic pattern 202 and the appentices 204a and 204b. Two opening portions on the downstream side in the application direction are made narrow by the appentice 204a and 204b, respectively.

In the structure shown in FIG. 22(D), as explained in the first embodiment, when ink is applied by means of the ink retention member in the direction indicated by the arrow 401, the meniscus surface of ink is easily moved along the inner surface of the inclined appentice 204a and 204b, and further, the ink in the liquid-repellent regions is retained until the meniscus surface goes off in the apical end portions of the appentice 204a and 204b. Thus, the ink amount on the linear main lyophilic pattern 201 is stabilized. It is possible to stably control the ultimate film thickness of the ink pattern.

In FIG. 22(D), the linear appentices 204a and 204b are formed at both ends of the U-shape of the auxiliary lyophilic pattern 202. However, the appentices may be formed in a curved shape or a doughnut shape which is partially cut.

(Eighth Embodiment)

An eighth embodiment will be described hereinafter with reference to FIG. 23.

In the first to seventh embodiments, the linear main lyophilic pattern of the lyophilic pattern is provided parallel to the application direction. However, even if the linear main lyophilic pattern of the lyophilic pattern is perpendicular to the application direction, it is possible to form a thick ink pattern on the linear main lyophilic pattern.

Figure 23A:
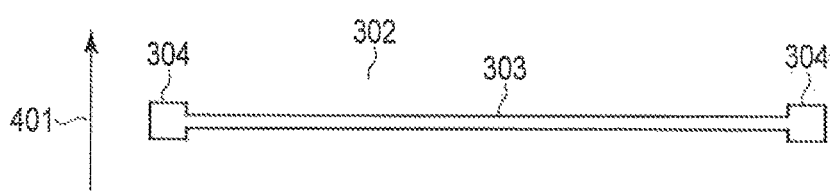
FIGS. 23A and 23B are shown for explaining a method of forming a pattern according to an eighth embodiment.

As shown in FIG. 23(A), a liquid-repellent layer 302 and a linear lyophilic pattern 303 are formed on a surface of a substrate (not shown). The linear lyophilic pattern 303 is formed between connection pads 304 on the both sides. Ink is applied in a direction which is perpendicular to the linear lyophilic pattern 303 and which is indicated by an arrow 401, the amount of ink formed on lyophilic pattern 303 tends to be larger than when ink is applied in a direction parallel with the linear lyophilic pattern 303. Thus, it is possible to form a thick ink pattern. However, when a pattern (for example, a conductive pattern) is formed by drying or curing an ink pattern, the film thickness may be insufficient depending on the purpose of use.

Figure 23B:
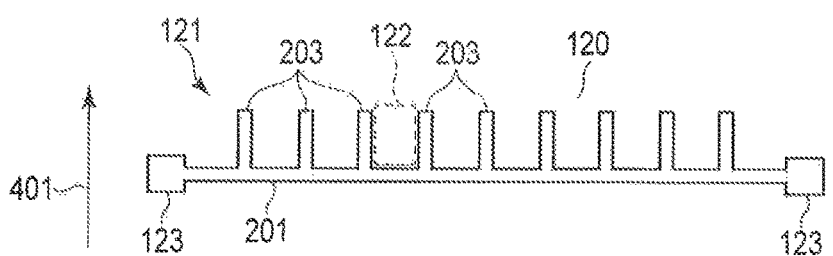

In this case, as shown in FIG. 23(B), a substrate (not shown) which has a liquid-repellent layer 120 and a linear lyophilic pattern 121 located adjacent to each other on a surface of the substrate, is employed. The linear lyophilic pattern 121 is formed between connection pads 123 on the both sides. The linear lyophilic pattern 121 comprises a linear main lyophilic pattern 201 and for example, nine linear auxiliary lyophilic patterns 203 connected to the main lyophilic pattern 201 in parallel with the application direction indicated by the arrow 401. By this structure, eight liquid-repellent regions 122 are defined in the liquid-repellent layer 120 between the main lyophilic pattern 201 and the linear auxiliary lyophilic pattern 203 so as to be closed on the upstream side and be open on the downstream side for the application direction indicated by the arrow 401, respectively. In this manner, the amount of ink on the main lyophilic pattern 201 is increased. It is possible to form a thick ink pattern.

The pitch and the length of the auxiliary lyophilic patterns 203 may be appropriately selected depending on, for example, the width and the length of the linear main lyophilic pattern 201. The application direction is not necessarily accurately perpendicular to the linear main lyophilic pattern 201. As stated above, even if the application direction has an angle with respect to the linear main lyophilic pattern 201, an effect is obtained.

(Ninth Embodiment)

A ninth embodiment will be described hereinafter with reference to FIG. 24.

Figure 24A:
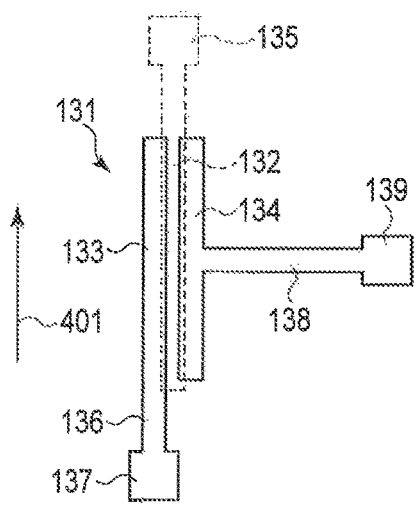
FIGS. 24A, 24B and 24C are shown for explaining a method of forming a pattern according to a ninth embodiment.
Figure 24C:
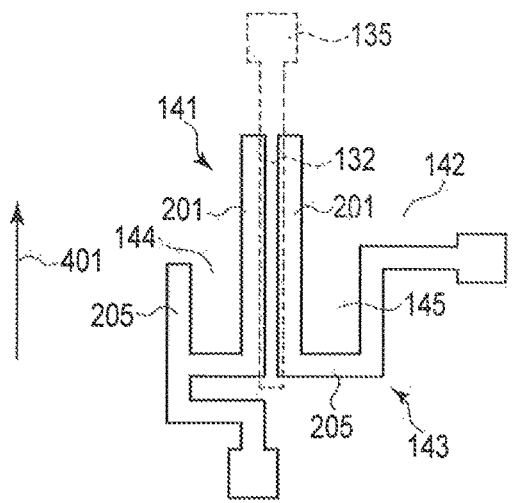
Figure 24B:
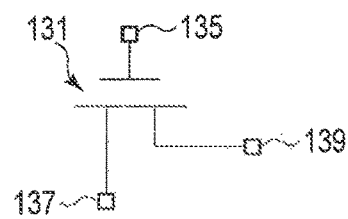

FIG. 24(A) is a plan view showing a semiconductor device. FIG. 24(B) is an equivalent circuit diagram of the device of FIG. 24(A). FIG. 24(C) is a plan view in which a method for forming a pattern in the ninth embodiment is applied to manufacturing of the device.

FIG. 24(A) shows a thin-film transistor (TFT) 131 comprising a substrate (not shown). A based insulating layer (not shown) is formed on the substrate. Further, a source electrode 133 and a drain electrode 134 are formed. An active layer (not shown) is formed on based insulating layer including the source electrode 133 and the drain electrode 134. A gate insulating layer (not shown) is formed on the active layer. A gate electrode 132 is formed on the gate insulating layer. One end of the gate electrode 132 is connected to a gate connection pad 135. The source electrode 133 is connected to a source connection pad 137 via an interconnection 136. The drain electrode 134 is connected to a drain connection pad 139 via an interconnection 138. Each of connection pads 135, 137 and 139 is connected to another interconnection (not shown) via a through-hole, etc. FIG. 24(B) shows an equivalent circuit of the device of FIG. 24(A). The TFT structure is a top-gate-bottom-contact structure. However, the TFT structure may be another structure, for example, a bottom-gate-bottom-contact structure.

Now, a method of forming the source and drain electrodes 133 and 134 and interconnections 236 and 138 connected to these electrodes is explained in the first embodiment. A liquid-repellent layer and a lyophilic pattern are formed on a surface of a substrate. A conductive ink pattern is formed on the lyophilic pattern through application of conductive ink and curing the ink pattern. As shown in FIG. 24(A), the source electrode 133 is connected to the source connection pad 137 via interconnection 136, and further, the drain electrode 134 is connected to the drain connection pad 139 via interconnection 138. Since the source electrode 133, interconnection 136 and the drain electrode 134 are substantially parallel with the application direction indicated by an arrow 401, they may be made thin. Therefore, in a case of a fine pattern, the performance of the TFT 131 may be reduced.

With reference to FIG. 24(C), a method of forming the source electrode 133, interconnection 136 and the source connection pad 137, and the drain electrode 134, interconnection 138 and the drain connection pad 139 on the (foundation) insulating film in the device comprising the above TFT will be described.

The insulating film is formed by a lyophilic resin film having a large surface free energy. After the whole surface of the insulating film is covered by a liquid-repellent layer, for example, laser ablation is applied to expose the surface of the lyophilic resin film from which the liquid-repellent layer is selectively removed. In this manner, a concave lyophilic pattern is formed. A source electrode side lyophilic pattern 141 is formed on the removal portions of a liquid-repellent layer 142 corresponding to the source electrode 133, interconnection 136 and the source connection pad 137. A drain electrode side lyophilic pattern 143 is formed on the removal portions of liquid-repellent layer 142 corresponding to the drain electrode 134, interconnection 138 and the drain connection pad 139.

The source electrode side lyophilic pattern 141 comprises a main lyophilic pattern 201 and an auxiliary lyophilic pattern 205 connected to the main lyophilic patterns 201. The main lyophilic pattern 201 is bent outward in a U-shape in the portion corresponding to interconnection 136. The auxiliary lyophilic pattern 205 is connected to the bent portion of the main lyophilic pattern 201 so as to be parallel with the application direction indicated by the arrow 401. A liquid-repellent region 144 is defined in the liquid-repellent layer 142 between the main lyophilic pattern 201 and the auxiliary lyophilic pattern 205. The liquid-repellent region 144 is closed by the portion connecting the main lyophilic pattern 201 and the auxiliary lyophilic pattern 205 on the upstream side for the application direction indicated by the arrow 401, and is open on the downstream side from the connection portion.

The drain-electrode-side lyophilic pattern 243 comprises the main lyophilic pattern 201 and the auxiliary lyophilic pattern 205. The auxiliary lyophilic pattern 205 is bent in a key-shape to the side opposite to the application direction in the portion corresponding to interconnection 138 and is connected to the end portion (the lower end portion on the paper plane) of the main lyophilic pattern 201 on the downstream side in the application direction. A liquid-repellent region 145 is defined in the liquid-repellent layer 142 between the main lyophilic pattern 201 and the auxiliary lyophilic pattern 205. A liquid-repellent region 145 is closed by the portion connecting the main lyophilic pattern 201 and the auxiliary lyophilic pattern 205 on the upstream side in the application direction indicated by the arrow 401, and is open on the downstream side from the connection portion.

By selectively removing liquid-repellent layer 142, the source electrode side lyophilic pattern 141 and the drain electrode side lyophilic pattern 143 are exposed and formed. Subsequently, conductive ink is applied by means of an ink retention member in the direction indicated by the arrow 401. By the effect explained in the first embodiment, ink is selectively applied to lyophilic patterns 141 and 143 whose contact angle relative to the ink is smaller than that of liquid-repellent layer 142 on the interlayer insulating film. In this manner, conductive ink patterns are formed. At this time, in the source electrode side lyophilic pattern 141, liquid-repellent region 144 is defined in the liquid-repellent layer 142 between the main lyophilic pattern 201 and the auxiliary lyophilic pattern 205. Thus, as explained in the first embodiment, a thick conductive ink pattern is formed on the main lyophilic pattern 201 corresponding to the source electrode 133. In a similar manner, liquid-repellent region 145 is formed in the drain-electrode-side lyophilic pattern 143. Thus, a thick conductive ink pattern is formed on lyophilic pattern 143 corresponding to the drain electrode 134. Subsequently, these conductive ink patterns are cured. In this manner, it is possible to form interconnection 136 and the source connection pad 137, interconnection 138 and the drain connection pad 139, and the thick source electrode 133 and the thick drain electrode 134 on the interlayer insulating film.

The auxiliary lyophilic pattern 205 of the drain electrode side lyophilic pattern 143 is incorporated into a part of interconnection 138, and functions to deliver electricity.

(Tenth Embodiment)

A tenth embodiment will be described hereinafter with reference to FIG. 25.

Figure 25A:
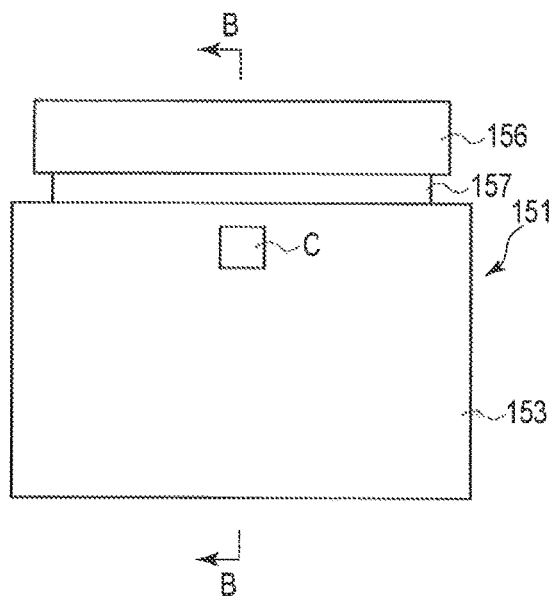
FIGS. 25A, 25B and 25C are shown for explaining a method of forming a pattern according to a tenth embodiment.
Figure 25B:
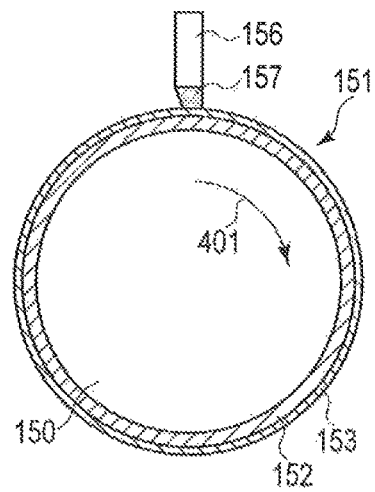
Figure 25C:
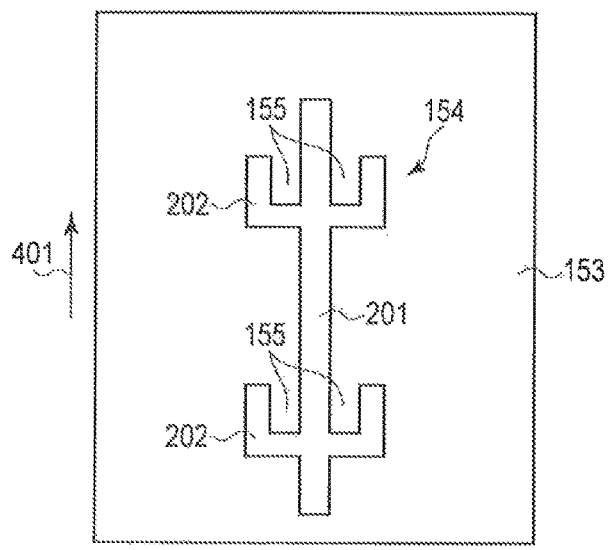

FIG. 25(A) is a front view showing a process of forming an ink pattern on, for example, a printing plate. FIG. 25(B) is a cross-sectional view taken along line B-B of FIG. 25(A). FIG. 25(C) is a plan view in which the C portion of FIG. 25(A) is enlarged.

The tenth embodiment is a method of forming an ink pattern on a printing plate and subsequently transcribing the ink pattern of the printing plate onto a substrate made of, for example, resin. In the method, the ink pattern is not directly formed on the substrate.

A printing plate 151 comprises a tubular printing cylinder 150, a liquid-repellent layer 153 and a base layer 152. The printing cylinder 150 rotates in a clockwise direction indicated by an arrow 401 and is made of, for example, metal. The liquid-repellent layer 153 and the base layer 152 are formed on the outer circumferential surface of the printing cylinder 150 in this order. The rotation direction of the printing cylinder 150 conforms to the application direction. The liquid-repellent layer 153 is formed by, for example, introducing a group including fluorine or a long-chain alkyl group into the surface of an organic resin layer as explained in the first embodiment. A lyophilic pattern 154 is defined in the liquid-repellent layer 153 by irradiating ultraviolet light, as shown in FIG. 25(C).

The lyophilic pattern 154 comprises a linear main lyophilic pattern 201 and a plurality of, for example, two auxiliary lyophilic patterns 202 connected to the main lyophilic pattern 201 with a desired distance along the main lyophilic pattern 201. Each auxiliary lyophilic patterns 202 has, for example, a U-shape bent at 90 degrees with respect to the longitudinal direction of the main lyophilic pattern 201 in two positions, and is connected to the main lyophilic pattern 201 in the middle position between the bent portions. Four liquid-repellent regions 155 are defined in the liquid-repellent layer 153 between the main lyophilic pattern 201 and the two auxiliary lyophilic patterns 202, respectively. In other words, two the liquid-repellent regions 155 are defined in two surface portions of the liquid-repellent layer 253 partitioned with the main lyophilic pattern 201 and one auxiliary lyophilic pattern 202, respectively. Each of liquid-repellent regions 155 has a rectangular shape which is closed by the portion connecting the main lyophilic pattern 201 and the auxiliary lyophilic pattern 202 on the upstream side for the application direction indicated by the arrow 401, in short, in the rotation direction, and is open on the downstream side from the connection portion. Two liquid-repellent regions 155 defined in the liquid-repellent layer 153 between the main lyophilic pattern 201 and one auxiliary lyophilic pattern 202 are symmetrically arranged on both sides of the main lyophilic pattern 201.

An ink retention member 156 is placed above the surface of the liquid-repellent layer 153 including the lyophilic pattern 154 on the printing plate 151 with a predetermined distance from the surface of the liquid-repellent layer 153. Ink 157 is retained between the ink retention member 156 and the surface of the liquid-repellent layer 153 including the lyophilic pattern 154.

The printing plate 151 is rotated in a clockwise direction indicated by the arrow 401. The retained ink 157 is also moved on the liquid-repellent layer 153 including the lyophilic pattern 154 on the printing plate 151. By the rotation of the printing plate 151, the meniscus surface (not shown) of the ink 157 is moved on the liquid-repellent layer 153 including the lyophilic pattern 154. In this manner, the ink 157 is applied. Since the four liquid-repellent regions 155 are defined in the liquid-repellent layer 153 between the linear main lyophilic pattern 201 and the auxiliary patterns 202 on lyophilic pattern 154, the effect explained in the first embodiment is exerted. By this effect, a thick ink pattern whose ink amount is large is formed on the linear main lyophilic pattern 201.

After forming the ink pattern, a substrate is brought into contact with the printing plate 151 and is pressed on the side facing the printing plate 151 by means of a pinch roller (not shown). Thus, the printing plate 151 is rotated in a clockwise direction, and further, the pinch roller is rotated in an anticlockwise direction. By this rotation, the ink pattern formed on the printing plate 151 is transcribed into the substrate. Subsequently, the substrate is removed from the printing plate 151, is dried and is cured, etc. in this manner, a thick pattern can be formed on the substrate.

According to the tenth embodiment, it is possible to indirectly form a thick ink pattern on the substrate by means of the printing plate without directly forming the ink pattern on the substrate.

With regard to the structure of lyophilic pattern 154 formed on liquid-repellent layer 153 of the printing plate 151, a groove structure may be employed in addition to the planar structure. Even if the lyophilic pattern is formed in a groove structure, the ink pattern can be excellently transcribed into the substrate by the above transcription process.

(Eleventh Embodiment)

An eleventh embodiment will be described hereinafter with reference to FIG. 26.

FIG. 26 shows a pattern (for example, a conductive pattern). A pattern 502 provides on a substrate 501. The pattern 502 comprises a linear main pattern 503 and two auxiliary patterns 504. Each auxiliary pattern 504 is bent in a portion away from the portion connected to the main pattern 503. The bent portion of the auxiliary pattern 504 is provided along the main pattern 503. Specifically, each auxiliary pattern 504 has a U-shape bent at 90 degrees in the longitudinal direction of the main pattern 503 in two positions, and is connected to the main pattern 503 in the middle position between the bent portions. The line width of each auxiliary pattern 504 is 0.2 to 5 times that of the main pattern 503. Each auxiliary pattern 504 is bent and connected to the main pattern 503. Each auxiliary pattern 504 is not connected to elements other than the main pattern 503.

The substrate may be a single substrate, or a substrate having a surface on which various films or various layers are formed. The substrate itself is made of, for example, glass, a semiconductor material such as silicon, or a plastic film. The films may be, for example, an interlayer insulating film and a gate insulating film. The layers may be, for example, a wire layer, an electrode layer and a semiconductor layer.

Each pattern may be formed of a conductive material such as metal, an insulating material such as an oxidation product, or a semiconductor material.

The pattern 502 is not limited to the structure formed on the planar substrate 501. The pattern 502 may be partially or entirely buried in a groove of the substrate.

The pattern 502 comprising the main pattern 503 and the auxiliary patterns 504 may comprise a lyophilic layer on the surface of the substrate immediately under the pattern 502. The contact angle of the lyophilic layer is preferably 2 to 25 degrees relative to the application ink used for the formation of the pattern 502.

Each auxiliary pattern 504 is not limited to a U-shape. For example, each auxiliary pattern 504 may be formed in a shape similar to the shapes of the auxiliary lyophilic patterns shown in FIG. 19(A) to FIG. 19(E), FIG. 20(A) and FIG. 20(B) or FIG. 22(A) to FIG. 22(D).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of forming a pattern comprising:
preparing a substrate having a liquid-repellent face and a lyophilic pattern which are located adjacent to each other on a surface of the substrate, the lyophilic pattern having a surface energy different from the liquid-repellent face;
retaining ink between an ink retention member and the surface of the substrate including the lyophilic pattern; and
moving the ink retention member relatively with respect to the substrate while the ink is kept in contact with the surface of the substrate, thereby applying the ink to the lyophilic pattern on the surface of the substrate,
wherein the lyophilic pattern comprises a linear main lyophilic pattern and an auxiliary lyophilic pattern connected to the main lyophilic pattern,
a liquid-repellent region is defined in the liquid-repellent face between the main lyophilic pattern and the auxiliary lyophilic pattern, and
the liquid-repellent region is closed by a portion connecting the main lyophilic pattern and the auxiliary lyophilic pattern on an upstream side for a move direction of the ink surface and is open on a downstream side from the portion.

2. The method of claim 1, wherein a plurality of auxiliary lyophilic patterns are connected to the main lyophilic pattern along the main lyophilic pattern.

3. The method of claim 2, wherein the plurality of auxiliary lyophilic patterns are connected to the main lyophilic pattern along the main lyophilic pattern in different pitches.

4. The method of claim 1, wherein a plurality of auxiliary lyophilic patterns are connected to the main lyophilic pattern along the main lyophilic pattern, when an area of a main lyophilic pattern portion located between connection portions of two adjacent auxiliary lyophilic patterns in a longitudinal direction of the main lyophilic pattern is defined as S1, and an area of the liquid-repellent region defined in the liquid-repellent face between the main lyophilic pattern and each of the auxiliary lyophilic patterns on the upstream side for the move direction of the ink surface of the main lyophilic pattern portion is defined as S2, S2 is greater than or equal to 0.02 times S1.

5. The method of claim 1, wherein a plurality of main lyophilic patterns are provided parallel to each other, and the auxiliary lyophilic pattern is connected to each of the main lyophilic patterns.

6. The method of claim 5, wherein in two adjacent main lyophilic patterns, the auxiliary lyophilic pattern connected to one of the two main lyophilic patterns is allocated so as to be out of alignment with the auxiliary lyophilic pattern connected to the other main lyophilic pattern along the main lyophilic patterns.

7. The method of claim 1, further comprising another liquid-repellent region which is adjacent to the liquid-repellent region on an upstream side for the move direction of the ink surface and is open on the upstream side.

8. The method of claim 1, wherein the ink is conductive ink in which metal nanoparticles are dispersed.

9. The method of claim 8, wherein after a conductive ink pattern is formed on the surface of the substrate by means of the conductive ink, the conductive ink pattern is further cured to form a conductive pattern.

10. A method of forming a pattern comprising:

preparing a printing plate having a liquid-repellent face and a lyophilic pattern which are located adjacent to each other on a surface of the printing plate, the lyophilic pattern having a surface energy different from the liquid-repellent face;

retaining ink between an ink retention member and the surface of the printing plate including the lyophilic pattern;

moving the ink retention member relatively with respect to the printing plate while the ink is kept in contact with the surface of the printing plate, thereby applying the ink to the lyophilic pattern on the surface of the printing plate to form an ink pattern; and transferring the ink pattern on the surface of the printing plate to a substrate, wherein the lyophilic pattern includes a linear main lyophilic pattern and an auxiliary lyophilic pattern connected to the main lyophilic pattern, a liquid-repellent region is defined in the liquid-repellent face between the main lyophilic pattern and the auxiliary lyophilic pattern, and the liquid-repellent region is closed by a portion connecting the main lyophilic pattern and the auxiliary lyophilic pattern on an upstream side for a move direction of the ink surface and is open on a downstream side from the portion.

* * * * *